United States Patent
Wong et al.

(10) Patent No.: US 8,208,334 B2
(45) Date of Patent: Jun. 26, 2012

(54) SYSTEMS, MEMORIES, AND METHODS FOR REFRESHING MEMORY ARRAYS

(75) Inventors: Victor Wong, Boise, ID (US); William F. Jones, Boise, ID (US); Seth A. Eichmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 12/702,037

(22) Filed: Feb. 8, 2010

(65) Prior Publication Data

US 2011/0194367 A1     Aug. 11, 2011

(51) Int. Cl.
*G11C 7/00* (2006.01)
(52) U.S. Cl. .................. 365/222; 365/230.03
(58) Field of Classification Search .............. 365/222, 365/230.03, 189.15, 189.16
See application file for complete search history.

(56) References Cited

U.S. PATENT DOCUMENTS

| | | | |
|---|---|---|---|
| 6,195,300 B1 | 2/2001 | Kirihata et al. | |
| 6,731,560 B2 | 5/2004 | Yoon et al. | |
| 6,754,114 B2 | 6/2004 | Horiguchi et al. | |
| 6,850,452 B2 * | 2/2005 | Keeth et al. | 365/226 |
| 7,145,828 B2 | 12/2006 | Lee et al. | |
| 7,263,021 B2 | 8/2007 | Lee | |
| 2004/0062069 A1 * | 4/2004 | Keeth | 365/63 |

* cited by examiner

*Primary Examiner* — Vu Le
(74) *Attorney, Agent, or Firm* — TraskBritt

(57) ABSTRACT

Memories, systems, and methods for refreshing are provided, such as a memory with an array of memory cells divided into sections. Memories include replacement elements having a digit line, and detecting circuitry coupled to a digit line of at least one section of the memory cell array and coupled to the digit line of the replacement element. Memories include control logic configured to selectively refresh the replacement element at an occurrence when a non-neighboring section of the memory cell array relative to the replacement element is refreshed. Other memories, systems, and methods are provided.

34 Claims, 12 Drawing Sheets

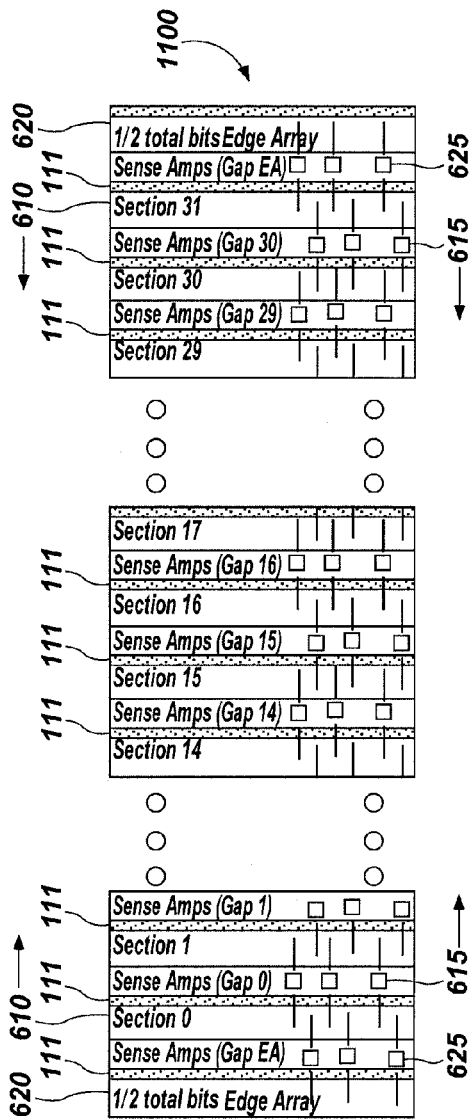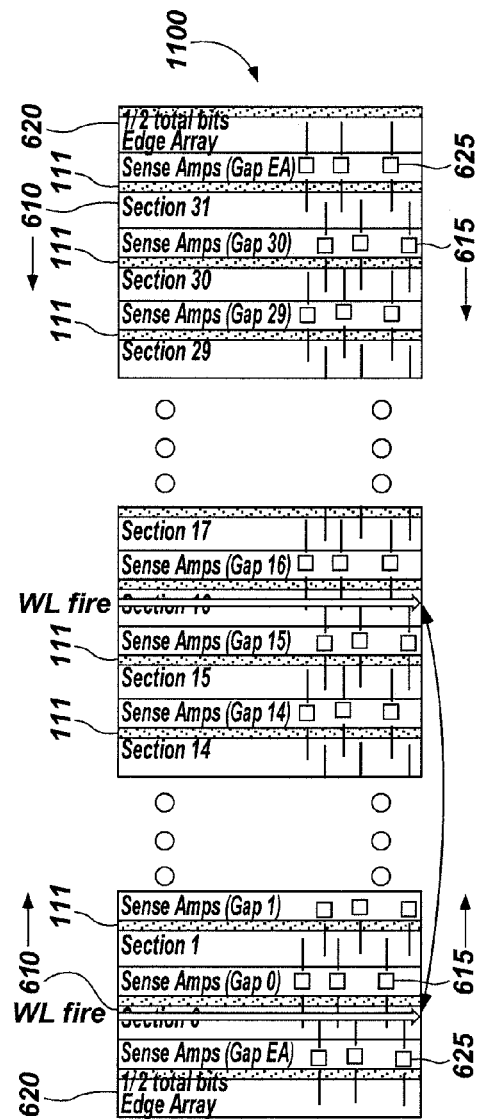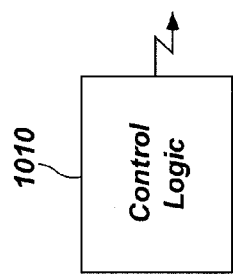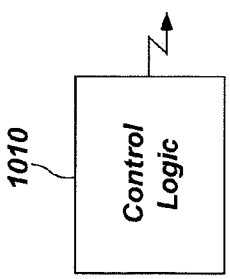
FIG. 11A    FIG. 11B

SYSTEMS, MEMORIES, AND METHODS FOR REFRESHING MEMORY ARRAYS

FIELD OF THE INVENTION

Embodiments of the present disclosure relate to semiconductor devices and, more particularly, to refreshing semiconductor memories.

BACKGROUND

A Dynamic Random Access Memory (DRAM) has memory arrays consisting of a number of memory cells arranged in rows and columns. In a conventional DRAM each memory cell (sometimes referred to as a memory bit or element) consists of one transistor and one capacitor. A terminal of the transistor is connected to a digit line (sometimes referred to as a bit line) of the memory device. Another terminal of the transistor is connected to a terminal of the capacitor, and the gate terminal of the transistor is connected to an access line (sometimes referred to as a word line) of the memory device. The transistor acts as a gate between the digit line and the capacitor. A second terminal of the capacitor is connected to a voltage rail that carries a voltage, such as VCC/2. When the word line for a particular cell is activated, the gate transistor is in a conducting state and the capacitor is connected to the digit line. The capacitor stores a charge that, depending on whether the polarity of the voltage across the capacitor is positive or negative, represents either a logic high value or a logic low value. For ease of discussion, and not limitation to any specific configuration, access lines and digit lines may also be referred to herein as rows and columns, respectively.

Conventionally, particular access and column select lines are activated to access selected memory cells. "Access" conventionally refers to reading data from, or writing data to, selected memory cells. Reading data from the memory cells conventionally involves the use of detecting circuitry (e.g., sensing circuitry including a sense amplifier), to determine whether the charge stored in a memory cell represents a binary one or a binary zero.

During test and operation, memory cells in the array may be discovered to be defective. Memory cells that are found to be defective may be replaced with a replacement (e.g., redundant) memory cell. Conventionally, the entire row or column with the defective memory cell is replaced with a replacement (e.g., redundant) row or column, respectively. For example, to replace a row with a defective memory cell, control logic, such as a row address decoder, may be programmed to map a replacement row to the address of the row which includes the defective memory cell, and to disable data access to the row which includes the defective memory cell. Therefore, when an external circuit attempts to read data from or attempts to write data to the defective row, the row address decoder may not activate the defective row but, instead, activates the replacement row so that data may be transferred to or from a corresponding addressed memory cell or cells within the replacement row. Replacement rows are conventionally distributed throughout the array. During refresh operations, replacement rows may be fired and refreshed at times when such an operation may cause data corruption or other failure. Such times may arise when adjacent rows, or any pair of rows sharing a sense amplifier, are refreshed during the same refresh operation.

FIG. 1 illustrates a simplified architecture of a memory array 100. Memory array 100 includes a core array 110 divided up into sections 0-31. Core array 110 sections include memory cells arranged in logical (and, in many cases, physical) rows. Data may be accessed by addressing the memory cells through control logic, such as a row decoder (not shown) and/or a column decoder 130 (Coldec). Between each section of the core array 110 is detecting circuitry (e.g., sensing circuitry) which may include sense amplifiers 115 (sa0-sa30). Distributed replacement elements 111 may be distributed throughout the sections of the core array 110. Distributed replacement elements 111 may be used to replace defective rows in the core array.

Row control logic (not shown) uses address inputs to determine which rows to activate in which sections. For example, row decoders (see FIG. 3) may be coupled to each core array 110 section to activate the currently addressed rows and the associated sense amplifiers 115. In addition, the row control logic is used to determine which replacement rows to activate in the distributed replacement elements 111 when the distributed replacement elements 111 are used to replace elements in the core array 110 sections. Meanwhile, the column decoder 130 may activate the appropriate digit lines from sense amplifiers 115 to pass the memory cells to the appropriate IO bus (not shown).

As an example, memory array 100 may be configured as a 64M array with approximately 16 k word lines. To create a 64M array with 16 k word lines, there may be as many as 4 k digit lines depending on the number of bits per digit line (i.e., width). In this 64M array example, 16 k word lines are addressed in order to access the information stored on the memory array 100. WL0 may be the first word line in section 0, and WL16$k$ may be the last word line in section 31. In memory array 100, each section includes 512 word lines.

FIG. 2 is a simplified circuit diagram of a sense amplifier 115, which may be used as a folded digit line sense amplifier or an open digit line sense amplifier. Memory devices are conventionally constructed with complementary digit lines of equal capacitance. Sense amplifiers are connected between the complementary digit lines and can operate to sense the differential voltage, differential current, or a combination thereof across the complementary digit lines. A sense amplifier 115, as illustrated in FIG. 2, features the sense amplifier circuits between arrays or sections of the memory array. True and complement digit lines D0 and D0* come from separate arrays or sections of the memory array on each side of the sense amplifiers. For the folded digit line sense amplifiers, the true and complement digit lines D0 and D0* come from the same side of the array or from the same section. As is generally known in the art, the term "sense amplifier" includes a collection of circuit elements connected to the complementary digit lines D0 and D0* of a DRAM array. This collection may include devices for equilibration and bias, one or more N-sense amplifiers, one or more P-sense amplifiers, and devices connecting activated digit lines to IO signal lines.

Operation of the sense amplifier 115 is accomplished by applying various signals to each sense amplifier to fire the sense amplifiers as is well known in the art. As shown in FIG. 2, sense amplifier 115 includes a P-sense amplifier 236 and an N-sense amplifier 234 for sensing charge stored in the activated memory cell of the activated array via a voltage differential on the pair of digit lines D0 and D0*.

An equilibration circuit 238 is provided to equilibrate the digit lines D0 and D0* and includes a transistor coupled between the digit line D0 and the complement digit line D0* and a gate coupled to receive an equilibration signal EQ. The equilibration circuit 238 also includes two transistors coupled in series between the digit line D0 and the complement digit line D0*. These two transistors also include gates coupled to the equilibration signal EQ. The two series transistors have drains coupled to an equilibration voltage Veq, which may be set to about Vcc/2. When the signal EQ is at a high logic level, the equilibration circuit 238 effectively shorts digit line D0 and complement digit line D0* such that they are both equilibrated to the voltage Veq.

The P-sense amplifier 236 and N-sense amplifier 234 operate to sense and amplify the differential signal between the pair of digit lines D0 and D0*. These amplifiers (234 and 236) work together to sense the accessed charge and drive the digit lines D0 and D0* to full voltage values of Vcc and ground. The N-sense amplifier 234 includes cross-coupled NMOS transistors and drives the low-potential digit line to ground. Similarly, the P-sense amplifier 236 includes cross-coupled PMOS transistors and drives the high-potential digit line to Vcc.

The common node of the cross-coupled NMOS transistors is labeled RNL*. Similarly, the common node of the cross-coupled PMOS transistors is labeled ACT (for ACTive pull-up). Initially, RNL* may be biased to Vcc/2 and ACT may be biased to ground. Since the digit line pair D0 and D0* are both initially at Vcc/2 volts, the N-sense-amplifier transistors remain off due to zero Vgs potential. Similarly, both P-sense-amplifier transistors remain off due to their positive Vgs potential. A signal voltage develops between the digit line pair D0 and D0* when the memory cell access occurs. While one digit line contains charge from the cell access, the other digit line serves as a reference for the sensing operation.

In many embodiments, the sense amplifier firing may occur sequentially rather than concurrently. The N-sense amplifier 234 may fire first and the P-sense amplifier 236 second. The N-sense amplifier 234 is fired by providing a signal, labeled NSA, to a transistor 235 connecting the common node of the N-sense amplifier 234 to ground. In other words, dropping the RNL* signal toward ground will fire the N-sense amplifier 234. As the voltage between RNL* and the digit lines approaches Vt, the NMOS transistor whose gate connection is to the higher-voltage digit line will begin to conduct. Conduction results in the discharge of the low-voltage digit line toward the RNL* voltage. Ultimately, RNL* will reach ground, bringing the digit line with it. Note that the other NMOS transistor will not conduct, since its gate voltage derives from the low-voltage digit line, which is discharging toward ground.

Shortly after the N-sense amplifier fires, ACT will be driven toward Vcc by applying a low-signal PSA* to PMOS transistor 237, connecting the common node of the P-sense amplifier to Vcc. This activates the P-sense amplifier 236 that operates in a complementary fashion to the N-sense amplifier 234. With the low-voltage digit line approaching ground, a strong signal exists to drive the appropriate PMOS transistor into conduction. This will charge the high-voltage digit line toward Vcc, ultimately reaching Vcc. Since the memory cell transistor remains on during sensing, the memory cell capacitor will charge to the RNL* or ACT voltage level. The voltage, and hence charge, which the memory cell capacitor held prior to accessing will restore a full level, i.e., Vcc for a logic one and GND for a logic zero.

When P-sense amplifier 236 and N-sense amplifier 234 have sensed the differential voltage across the digit lines D0 and D0*, a signal representing the charge stored in the accessed memory cell is output from the sense amplifier 115 on the IO lines IO and IO*. An access block 239 includes two NMOS transistors that when enabled by a columns select signal CSEL, enable the transfer of voltage from the D0 signal to the IO signal and from D0* signal to the IO* signal.

To write to a memory bit, appropriate voltage levels of ground and VCC are placed on the IO and IO* signals and when CSEL is activated, those appropriate voltage levels will be driven onto the D0 and D0* signal respectively. The values on D0 and D0* are written into the appropriate memory cells that are activated corresponding to with a row address. Most of the discussion of operation herein focuses on reading the memory arrays. However, unless otherwise specified, memory accesses discussed herein should be considered to cover both reads and writes. Unless a write operation is specifically discussed, a person of ordinary skill in the art would be able to readily understand any differences between performing a read operation and a write operation. Furthermore, FIG. 2 is shown as one example of a sense amp to discuss general sense amp operation. Those of ordinary skill in the art will recognize that many sense amp designs and configurations can be used in embodiments of the present invention.

FIG. 3 illustrates a simplified architecture of a memory array 300 including a plurality of sub-arrays 301-304. In memory array 300, sub-arrays 301 and 302 are divided with a shared row decoder 305 to form a P side. Sub-arrays 303 and 304 are divided with a shared row decoder 306 to form a Q side. Each sub-array 301-304 may be configured similar to the individual memory array of FIG. 1. For example, each sub-array 301-304 may have its own column decoder 130. Each sub-array 301-304 may include distributed replacement elements 111 (not shown in FIG. 3; see FIG. 1) distributed throughout the sections of the core array 110. Distributed replacement elements 111 may be used as replacement elements for repairing defects associated with word lines of the sections of the sub-arrays 301-304. Distributed replacement elements 111 may also be used to replace word lines of the sections of the sub-arrays 301-304 for reasons other than repairing defects.

As an example, memory array 300 may be configured as a 256M array with approximately 32 k rows. With 32 k rows, memory array 300 may have as many as 8 k columns depending on the number of bits per column (i.e., width). For example, the P side of memory array 300 includes word lines 0-16 k, and the Q side of memory array 300 includes word lines 16 k-32 k. In other words, 32 k word lines are addressed in order to access the information stored on the memory array 300. To build a 256M array with four sub-arrays 301-304, each sub-array 301-304 may be a 64M memory array configured as described and shown in FIG. 1.

In operation, a word line is activated (also referred to as fired) horizontally from the row decoder 305 when oriented as shown in FIG. 3. Digit lines are activated vertically from the column decoders when oriented as shown in FIG. 3. For example, FIG. 3 shows word line 2056 being activated by firing across both sub-arrays 301, 302 on the P side of memory array 300.

FIG. 4 illustrates a simplified memory array 400 undergoing a refresh operation. Memory array 400 is configured as before with respect to FIG. 3 with sub-arrays 301-304 configured to share row decoders 305 and 306 to be divided into a P side and a Q side. As with FIG. 3, the present example shows a 256M memory array with four 64M sub-arrays. The P side is addressed from 0-16 k, and the Q side is addressed from 16 k-32 k. The core array 110 for each sub-array 301-304 is divided into 32 sections (sections 0-31), each section including 512 word lines. In other words, there are sections 0-31 for each of sub-arrays 301-304. Although FIG. 4 shows sections 0-31 on both of the P side and the Q side, other terminology may also be used. For example, the P side may include the sections 0-31 and the Q side may include sections 32-63.

A refresh operation may refer to an access of a word line. A refresh operation may include activating of multiple word lines concurrently or substantially concurrently with each other. The number of word lines activated during the same refresh operation may be related to the density of the memory array and the refresh rate. As discussed herein, when such a refresh operation is performed on neighboring word lines, data contention or noise may be introduced which may cause the memory array to not function properly.

The refresh operation illustrated in FIG. 4 is an 8 k refresh operation. This refresh rate refers to the number of word lines that are refreshed before starting over. Word lines are often refreshed sequentially as a row address counter increments the address of the word line to be refreshed. Conventionally, the refresh rate may be equal to the number of word lines in the memory array, such that one word line is refreshed at a time. For example, the first word line is refreshed and each subsequent word line is individually refreshed. When the last word line is refreshed, the refresh operation returns to the first word line.

The refresh rate may alternatively be different than the total number of word lines in a memory array needed to be refreshed. In that situation, in order for each word line to be refreshed, a plurality of word lines may need to be refreshed during the same refresh operation. For example, the 256M memory array illustrated in FIGS. 3 and 4 has sub-arrays 301-304 which form a P side and a Q side with shared row decoders for a total of 32 k word lines. Each of the 64M sub-arrays 301-304 have 16 k word lines. The refresh operation may increment in an upper half and a lower half of the memory array on both the P side and the Q side during the same refresh operation. In other words, in order to complete an 8 k refresh operation on a conventional 256M memory array with 32 k word lines, the refresh operation fires four times as many rows as would be required by the 256M memory array in a normal activation. A 64M array with 16 k word lines would fire two times as many rows at a time as would be required in a normal row activation. A normal row activation refers to a refresh rate equal to the number of word lines of the memory array (i.e., one word line is fired at a time).

In operation, in order to accomplish an 8 k refresh for 32 k word lines of the 256M array of FIG. 4, two rows may be fired on the P side, and two rows may be fired on the Q side during the same refresh operation. For example, in FIG. 4, word lines in sections 0 and 16 are fired in the same refresh operation on both the P side and the Q side of memory array 400. Sections 0 and 16 on the Q side may also be referred to as sections 32 and 48, respectively.

Because of the configuration of most conventional memory arrays, it may be easiest for sections that are 16 sections apart to fire at the same time (e.g., 0 and 16, 1 and 17, 15 and 31, and so on). This may be because two memory addresses may be configured to decode the memory array into sections. For example, the most significant bit of an address (e.g., address bit 14) may decide whether the row to be activated is on the P side or the Q side. The next most significant bit of an address (e.g., address bit 13) may decide whether the row to be activated is on the upper half (e.g., sections 16-31) or lower half (e.g., sections 0-15) of the memory array 400. Therefore, in order to fire four different rows during a refresh operation at substantially the same time, two of these addresses may become "don't care" sections (i.e., ignored bits), which allows an upper section and a lower section of both P and Q sides to fire at substantially the same time.

FIGS. 5A through 5C illustrate simplified memory arrays 500 undergoing a refresh operation, further showing the operation of detecting circuitry. As in previous examples, memory array 500 comprises a core array 110 divided into array sections. In these examples, memory array 500 may be configured as a 64M memory array with thirty-two core array sections (sections 0-31), such as might be used alone or as a sub-array on the P or Q side of a 256M memory array. Core array 110 sections (0-31) may 512 word lines in this example. Memory arrays 500 may also include distributed replacement elements 111 (not shown in FIGS. 5A through 5C; see FIG. 1) distributed throughout the sections of the core array 110. Distributed replacement elements 111 may be used as replacement elements for repairing defects associated with word lines of the sections of the core array 110. Distributed replacement elements 111 may also be used to replace word lines of the sections of the core array 110 for reasons other than repairing defects.

Detecting circuitry, such as sense amplifiers 115, are located in the gaps between sections of the core array 110. In an open digit line architecture, a section on one side of the sense amplifiers 115 is used as the active array for a group of sense amplifiers 115, and a section on the other side of the sense amplifiers 115 is used as a reference array for that group of sense amplifiers 115. For example, when section 2 is fired, section 1 or section 3 (not shown) serves as a reference array for the sense amplifiers 115 between sections 1 and 2 (gap 1) or the sense amplifiers 115 between sections 2 and 3 (gap 2), respectively. Similarly, when section 31 is fired, section 30 or section 32 serves as a reference array for the sense amplifiers 115 between sections 30 and 31 (gap 30) or for the sense amplifiers 115 between sections 31 and 32 (gap 31).

In FIG. 5B, a word line may be fired during a refresh operation. In this example, sections 1 and 17 are refreshed (i.e., fired) during the same refresh operation of an 8 k refresh operation. During refresh, when a word line fires in section 1, memory cells coupled to that word line are refreshed by sense amplifiers 115 in both gap 0 and gap 1. As a result, the sense amplifiers 115 in gap 0 use section 0, and the sense amplifiers 115 of gap 1 use section 2, as a reference array to properly refresh the correct charge on the accessed memory cells of section 1. When a word line fires in section 17, memory cells coupled to that word line are refreshed by sense amplifiers 115 in both gap 16 and gap 17. As a result, the sense amplifiers 115 in gap 16 use section 16, and the sense amplifiers 115 in gap 17 use section 18, as a reference array to properly refresh the correct charge on the accessed memory cells of section 17.

In FIG. 5C, a word line may be fired during a refresh operation. Refresh operations conventionally refresh sequentially as a refresh counter increments to generate the refresh address. In this example, sections 2 and 18 are refreshed during the same refresh operation of an 8 k refresh operation. During refresh, when a word line fires in section 2, memory cells coupled to that word line are refreshed by sense amplifiers 115 in both gap 1 and gap 2. As a result, the sense amplifiers 115 in gap 1 use section 1, and the sense amplifiers 115 in gap 2 use section 3, as a reference array to properly refresh the correct charge on the accessed memory cells of section 2. When a word line fires in section 18, memory cells coupled to that word line are refreshed by sense amplifiers 115 in both gap 17 and gap 18. As a result, the sense amplifiers 115 in gap 17 use section 17, and the sense amplifiers 115 in gap 18 use section 19 as a reference array to properly refresh the correct charge on the memory cells of section 18.

A problem may arise when word lines fire during the same refresh operation in adjacent sections of the memory array 500. Detecting circuitry shares the digit lines across the sections. Sharing digit lines across sections allows detecting circuitry to act as a comparator, using an adjacent section as a reference array in order to determine the charge (e.g., 1 or 0) of the memory cells in the array that is being accessed. Under normal circumstances, for example, a sense amplifier turns on to detect either a 1 or a 0 on the memory cell of the accessed array in relation to an adjacent reference array that does not turn on. However, if two adjacent sections are fired in the same refresh operation, the reference function for the sense amplifiers between those two sections may be influenced, which may cause a failure (e.g., from the resulting data corruption) in the refresh operation. In other words, adjacent sections may both send data (rather than reference signals from one side) to sense amplifiers. When a section is fired, adjacent sections which normally are used as a reference may be marginalized because of the common sharing of sense amplifiers.

In the example shown in FIG. 5B, section 1 and section 17 are refreshed during the same refresh operation. If however, a defective element exists in a word line in section 17, then that word line may be replaced (or replaced for other reasons) by re-mapping the address of the word line in section 17 to an address for a distributed replacement element. Suppose for this example, that the distributed replacement element used to replace the defect in section 17 is distributed in section 2. During a conventional refresh operation, when sections 1 and 17 are refreshed, section 1 and the distributed replacement element in section 2 would fire because the address for the word line in section 17 had been replaced by distributed replacement elements in section 2. Because section 1 and section 2 share sense amplifiers in gap 1, data contention on the sense amplifiers may exist. This may cause a failure, and there may be a significantly diminished ability to sense a charge because the reference function needed by the sense amplifiers may not operate properly.

Another problem may arise for the situation when other nearby sections (e.g., one section away) are refreshed during the same refresh operation. For example, if section 3 had been used as the replacement solution (e.g., repair solution) for section 17. In this situation, the data contention issue may not be a problem because section 1 and section 3 do not share a sense amplifier. However, because the sections are nevertheless close in proximity, there may be coupling which may increase noise when the sense amplifiers are fired. With data toggling on signals near each other, weaker sensing margins by the sense amplifiers may be experienced from the induced noise into the sense amplifiers.

In this example, the reference array for section 3 is section 2 or section 4, as the case may be. The reference array for section 1 is section 2 or section 0, as the case may be. In other words, because section 2 acts as a reference array during the same refresh access of both section 1 and section 3, coupling and noise may be increased, which may reduce some of the sensing margins of the sense amplifiers. Accordingly, firing of adjacent sections of the memory array 500 during the same refresh operation may cause failure due to data contention from sharing sense amplifiers with the reference array. Firing of sections of the memory array 500 during the same refresh operation that are nearby (e.g., one section apart) may cause a failure due to increased noise due to coupling between nearby signals.

One way that these problems have conventionally been avoided is to manage the replacement solution rather than the refresh. During replacement, the replacement solution may conventionally be linked across the 8 k word line boundary. In other words, a distributed replacement element in the lower half of the memory array 500 could be used for replacement of, for example, section 1. Conversely, a distributed replacement element in the upper half of the memory array 500 could be used for replacement of, for example, section 17. The locations of the distributed replacement elements to be used are also spaced in relation to each other across the 8 k boundary. In other words, if the distributed replacement element in the lower half (the replacement solution for section 1 in this example) and the distributed replacement element in the upper half (the replacement solution for section 17 in this example) are assured a spacing of 16 sections apart, then there will not be a firing of adjacent or other nearby sections.

For example, if the first word line in section 1 is defective, then that word line is re-mapped to a distributed replacement element in the lower half of the memory array 500. In order to be certain to avoid data contention and/or significant noise under conventional replacement solutions and refresh operations, the first word line in section 17 would also need to be re-mapped (i.e., linked) to a corresponding distributed replacement element in an adjacent repair plane which is linked across the 8 k boundary. This is true regardless of whether or not the first word line in section 17 was defective or otherwise needed replacement. In other words, the replacement of section 17 is tied to (i.e., dependent on) the replacement of section 1, and vice versa. When it comes time to refresh the first word lines in sections 1 and 17, they both have been re-mapped to distributed replacement elements that are linked across the 8 k boundary and appropriately spaced to avoid data contention and/or significant noise, but a distributed replacement element has also potentially been wasted.

Additionally, as more defects in the memory array 500 are repaired (or as other replacements are made), there may be distributed replacement elements available for replacement, but these available distributed replacement elements are not properly spaced for the defective word lines that are to be replaced. Therefore, even though the replacement solution can be effective at avoiding data contention and/or significant noise from refreshing neighboring sections, such problems cannot be assured to be avoided for each distributed replacement element.

The inventors have appreciated that there is a need for methods, memories, and systems regarding refresh of rows within replacement elements of the memory array to avoid or reduce data corruption caused by refreshing row addresses which have been re-mapped to distributed replacement elements near a row (e.g., when distributed replacement elements share a sense amplifier) that is also being refreshed in the same refresh operation. Rather than solving the problem through the replacement solution, the inventors have appreciated that solving the problem during refresh may also increase flexibility to the replacement solution and improve yield.

BRIEF DESCRIPTION OF THE DRAWINGS

In the drawings, which illustrate embodiments of the invention:

FIGS. 11A through 11C illustrate a memory array undergoing a refresh operation with distributed replacement elements according to an embodiment of the present invention.

DETAILED DESCRIPTION

Figure 1:
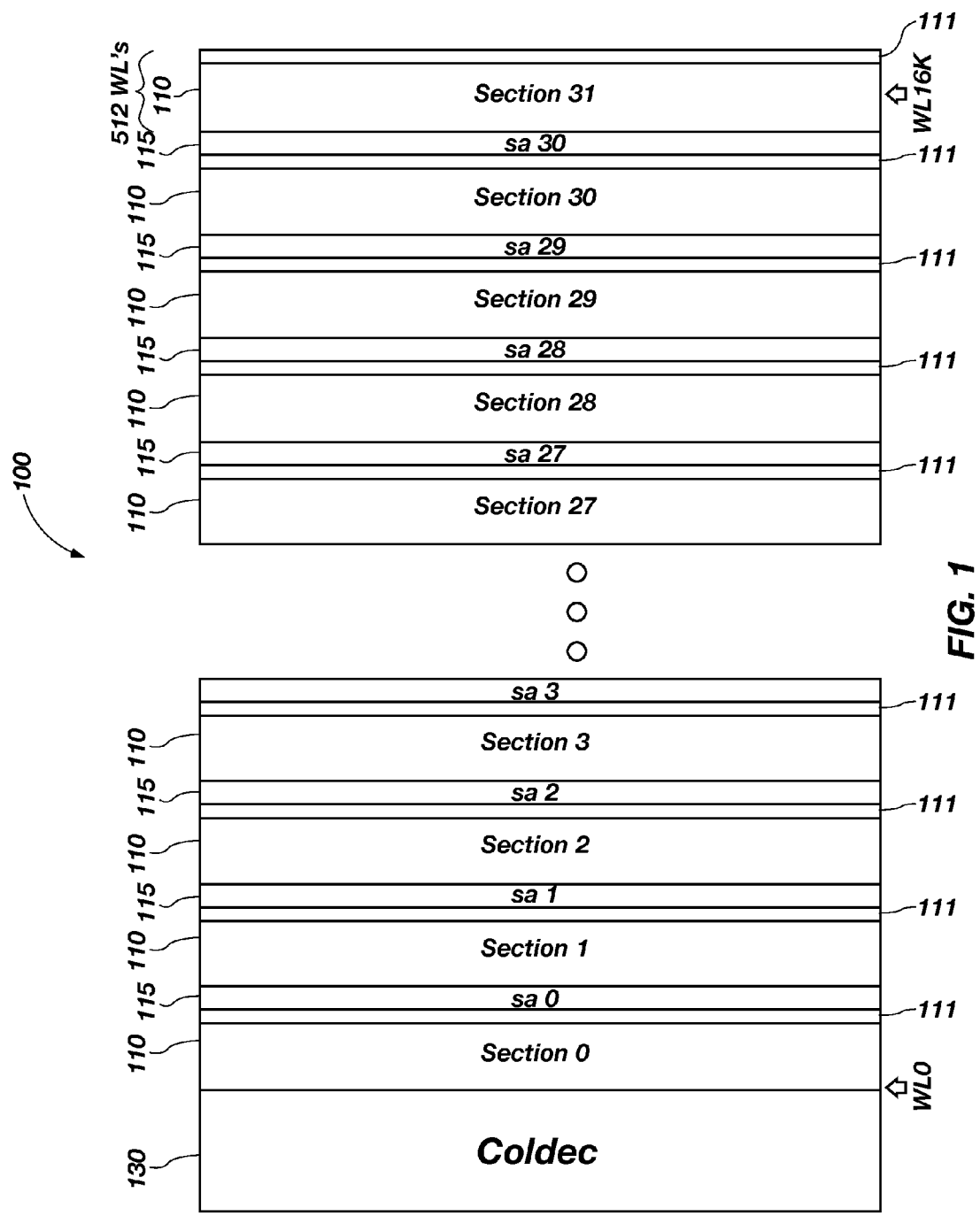
FIG. 1 illustrates simplified architecture of a memory array.
Figure 2:
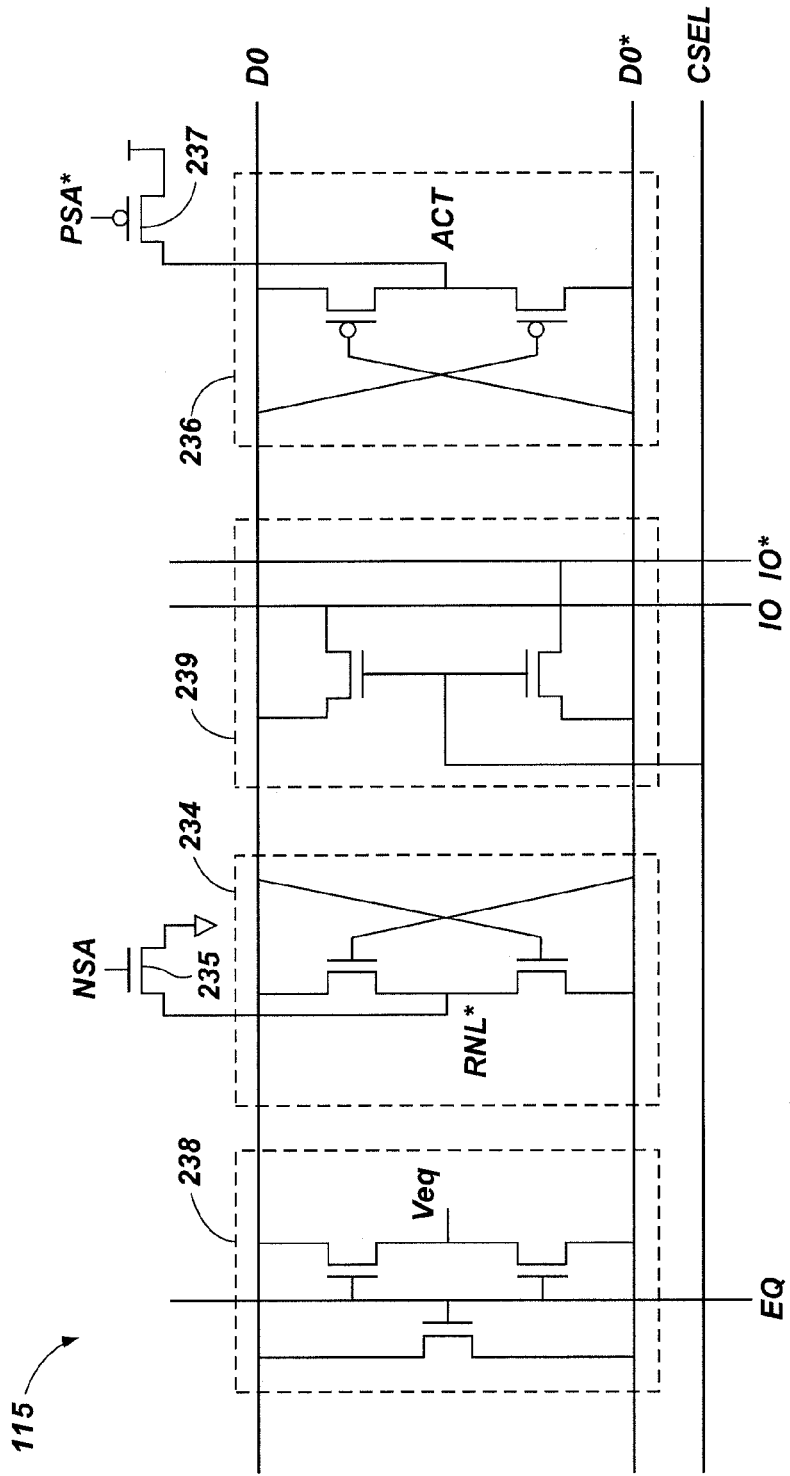
FIG. 2 is a simplified circuit diagram of a sense amplifier, which may be used as a folded digit line sense amplifier or an open digit line sense amplifier.
Figure 3:
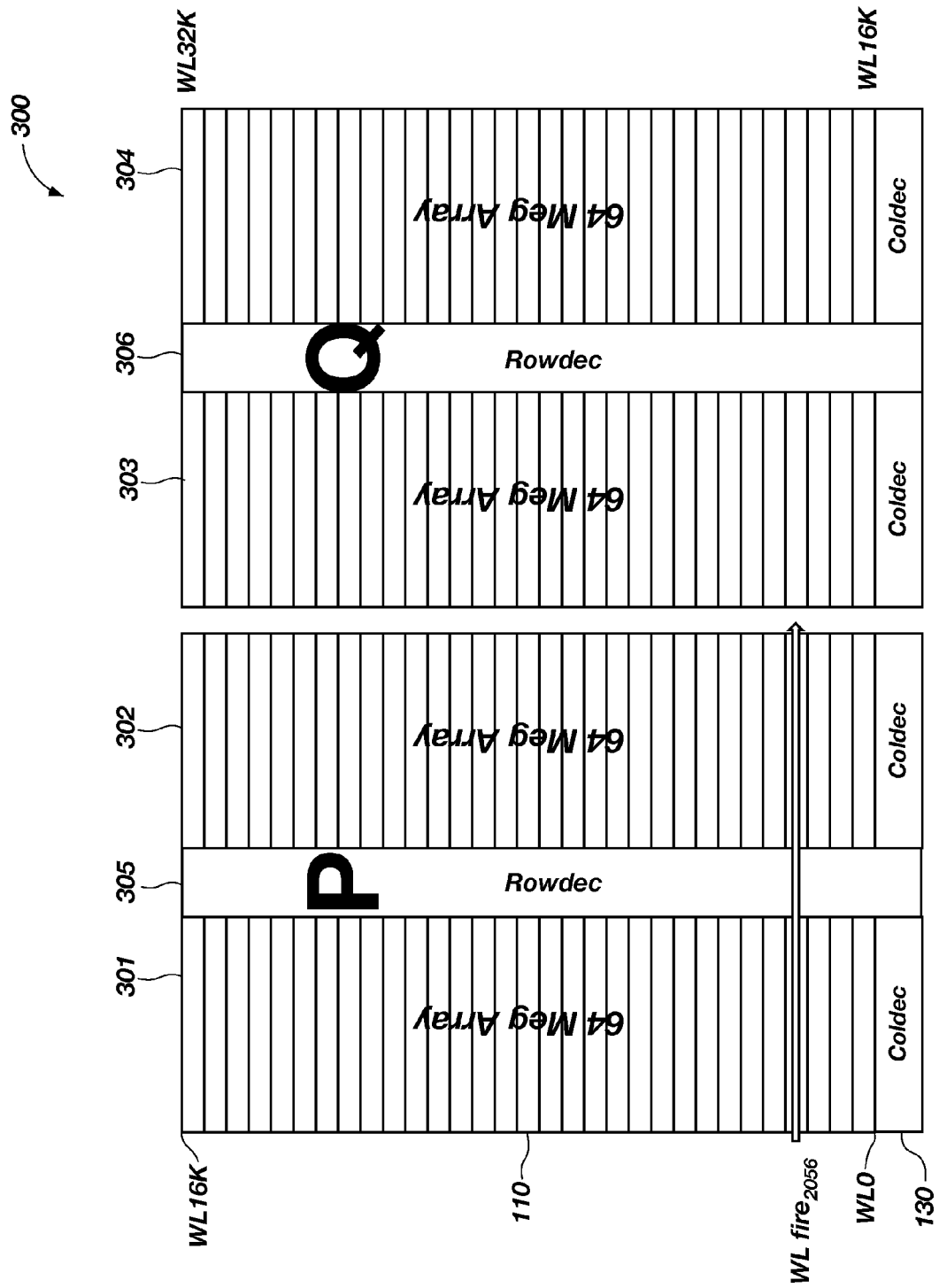
FIG. 3 illustrates a simplified architecture of a memory array including a plurality of sub-arrays.
Figure 4:
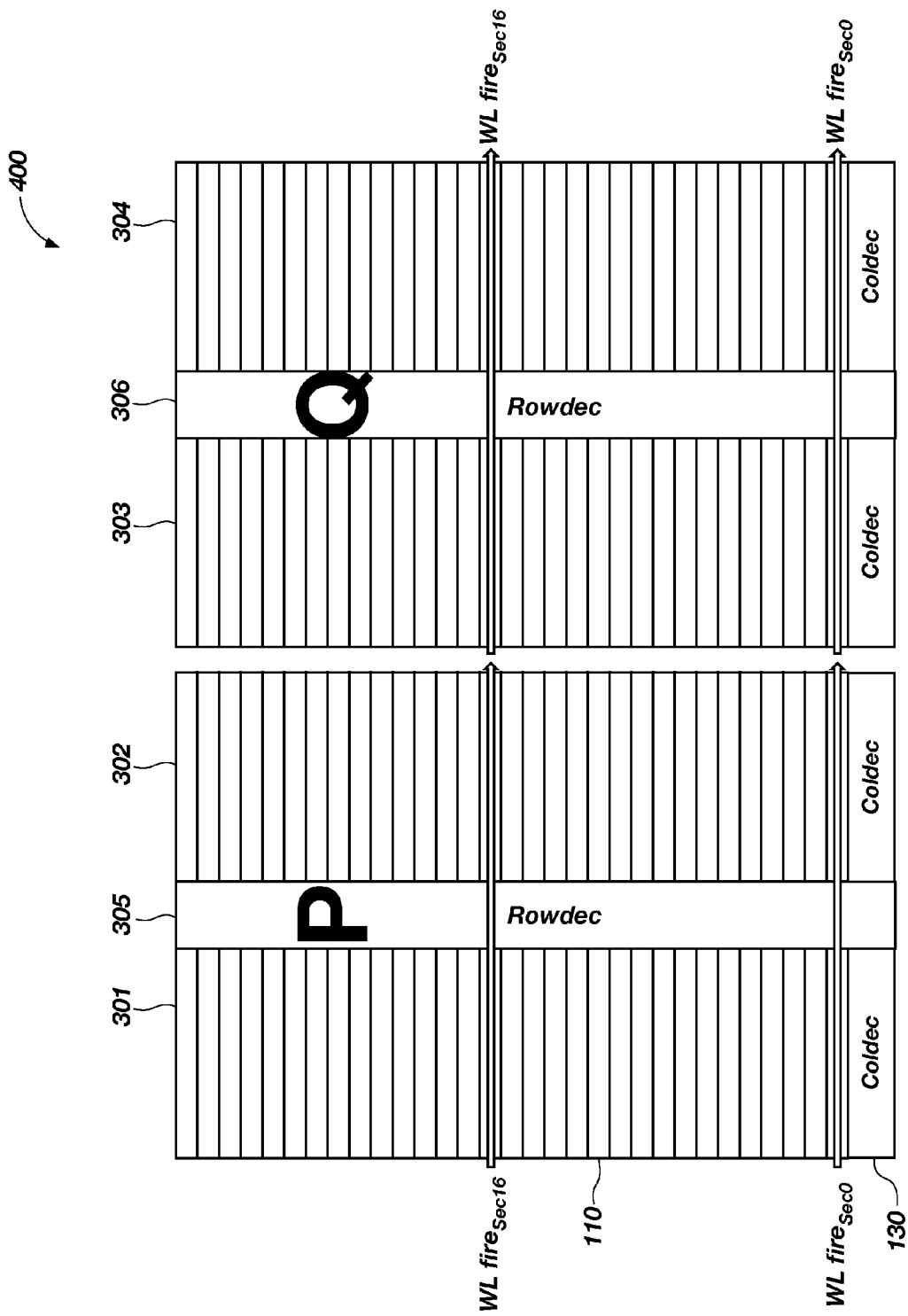
FIG. 4 illustrates a memory array undergoing a refresh operation.
Figure 5A:
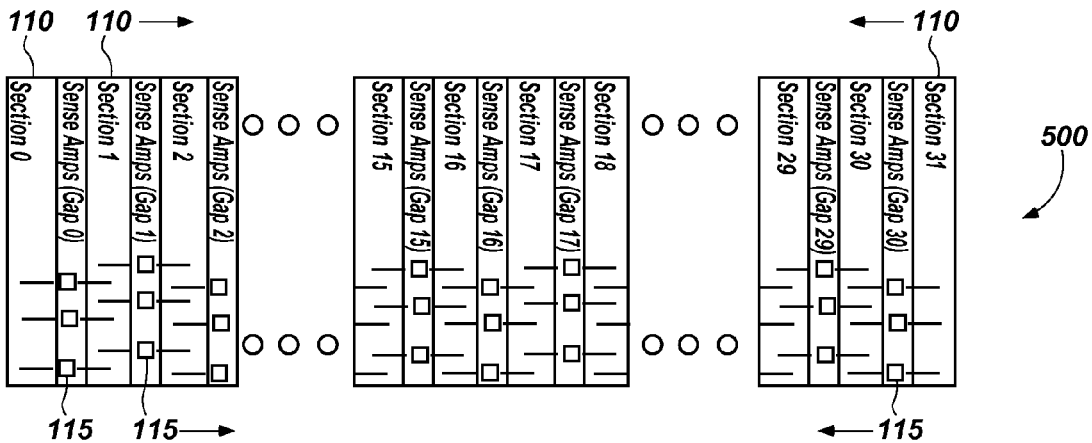
FIGS. 5A through 5C illustrate simplified memory arrays undergoing a refresh operation, further showing the operation of detecting circuitry.
Figure 5B:
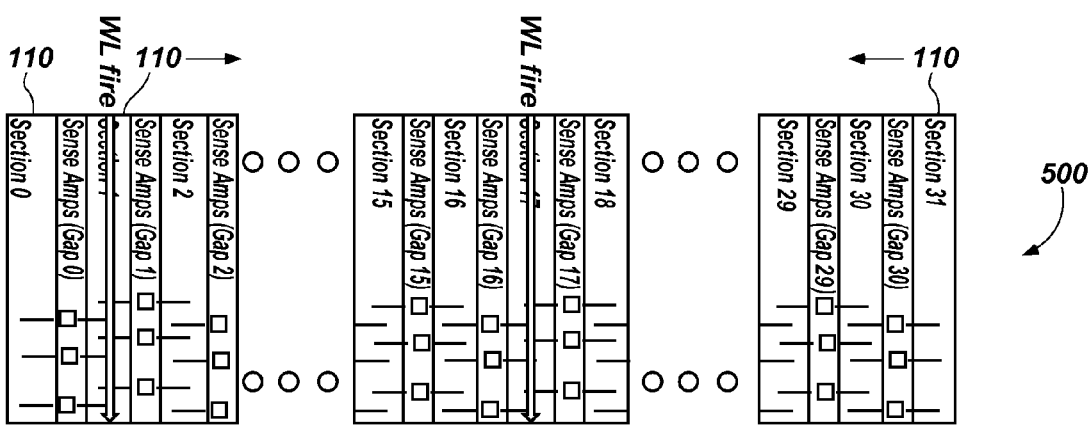
Figure 5C:
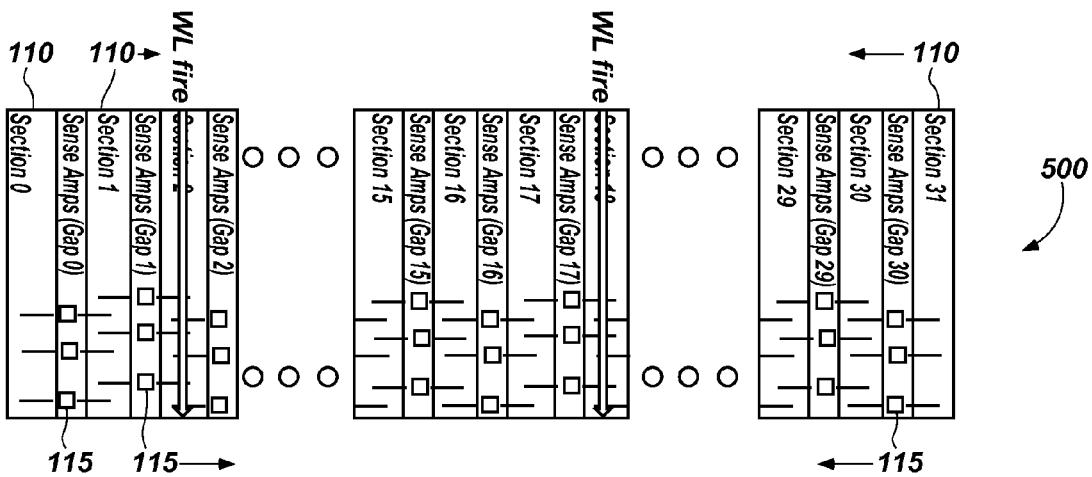

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

Embodiments of the present invention may include methods, memories, and systems which manage refresh operations and replacement priorities for memory arrays with replacement elements. Such replacement elements may include replacement elements in an edge array, replacement elements distributed throughout the core array, or any combination thereof.

It should be noted that, for ease of description, a word line having a defect associated therewith may be referred to herein as a defective word line, wherein "defective word line" and "bad word line" each mean a word line with a defect associated therewith. In other words, any defect on the memory array that would cause improper data to be read or written when a word line is fired would result in that word line being characterized as a defective word line. Furthermore, the discussion herein refers primarily to replacement of defective word lines with replacement elements. However, embodiments of the present invention are not so limited. As some non-limiting examples, a normally addressed word line may be replaced with a replacement word line for a number of reasons, such as noise reduction, power distribution, reducing the firing of rows in nearby arrays, and the like.

Figure 6:
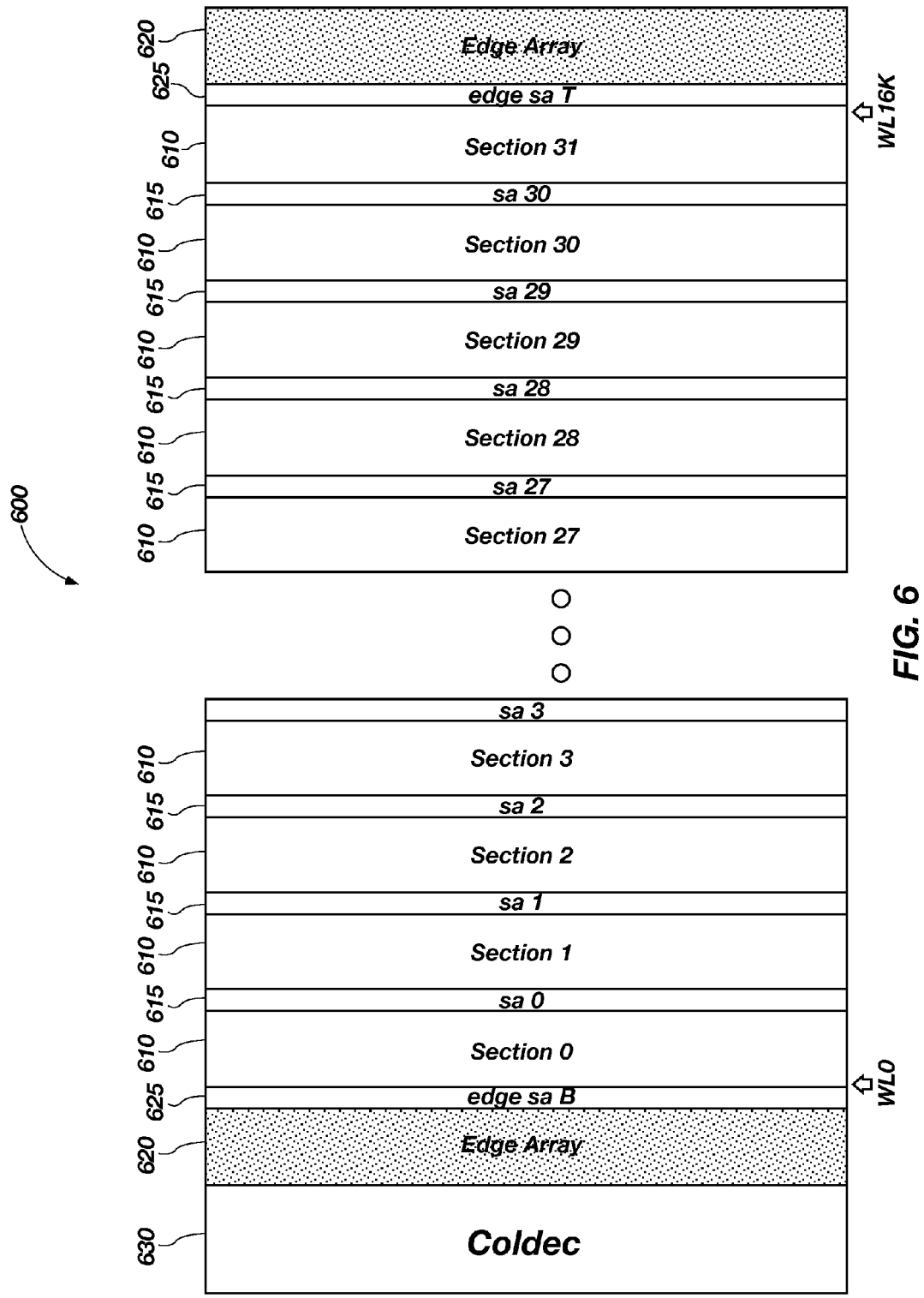
FIG. 6 illustrates a simplified architecture of a memory array with replacement elements as edge arrays.

FIG. 6 illustrates a simplified architecture of a memory array 600 with replacement elements as edge arrays 620. Memory array 600 includes a core array 610 divided up into sections 0-31. Core array 610 sections include memory cells arranged in logical (and, in many cases, physical) rows. Data may be accessed by addressing the memory cells through control logic, such as a row decoder (not shown) and/or a column decoder 630 (Coldec). Between each section of the core array 610 is detecting circuitry (e.g., sensing circuitry), which may include sense amplifiers 615 (sa0-sa30). Replacement elements may be incorporated into the memory array 600 as edge arrays 620 located on the ends of the core array 610. Between the core array 610 and the edge arrays 620 is detecting circuitry (e.g., sensing circuitry), which may include edge sense amplifiers 625 (edge sa T, B). It should be noted that, as used herein, the terms "core array" and "edge array" may be used to distinguish between the physical locations of the arrays, but not necessarily to indicate a particular meaning or functionality unless otherwise specified. In this example, the edge arrays 620 may be used as replacement elements to replace defective elements in the core array 610. Replacement elements may replace elements in the core array 610 for other reasons.

Replacement elements in the edge arrays 620 may be configured similarly to the sections of the core array 610 (e.g., 512 word lines); however, other configurations of replacement elements may exist. For example, edge arrays 620 may include more or fewer word lines than included in sections of the core array 610. Replacement elements may be distributed throughout the core array 610 sections in addition, or alternatively, to the edge array 620.

Row control logic (not shown) uses address inputs to determine which rows to activate in which sections. For example, row decoders (not shown) may be coupled to each core array 610 section to activate the currently addressed rows and the associated sense amplifiers 615. In addition, the row control logic may be used to determine which replacement rows to activate in the replacement elements of the edge arrays 620 when the edge arrays 620 are used to replace elements in the core array 610 sections. Meanwhile, the column decoder 630 may activate the appropriate digit lines from sense amplifiers 615, 625 to pass the memory cells to the appropriate IO bus (not shown).

As an example, memory array 600 may be configured as a 64M array with approximately 16 k word lines. To create a 64M array with 16 k word lines, there may be as many as 4 k digit lines depending on the number of bits per digit line (i.e., width). While specific sizes of memory arrays, number of sections, word lines, digit lines, detecting circuitry, and so forth may be referenced throughout this description, these are to be viewed as examples, and for illustration purposes only. Those of ordinary skill in the art will recognize that different sizes (i.e., storage capacity) of memory arrays may be used. In this 64M array example, 16 k word lines are addressed in order to access the information stored on the memory array 600. WL0 may be the first word line in section 0, and WL16k may be the last word line in section 31. In memory array 600, each section includes 512 word lines.

Figure 7:
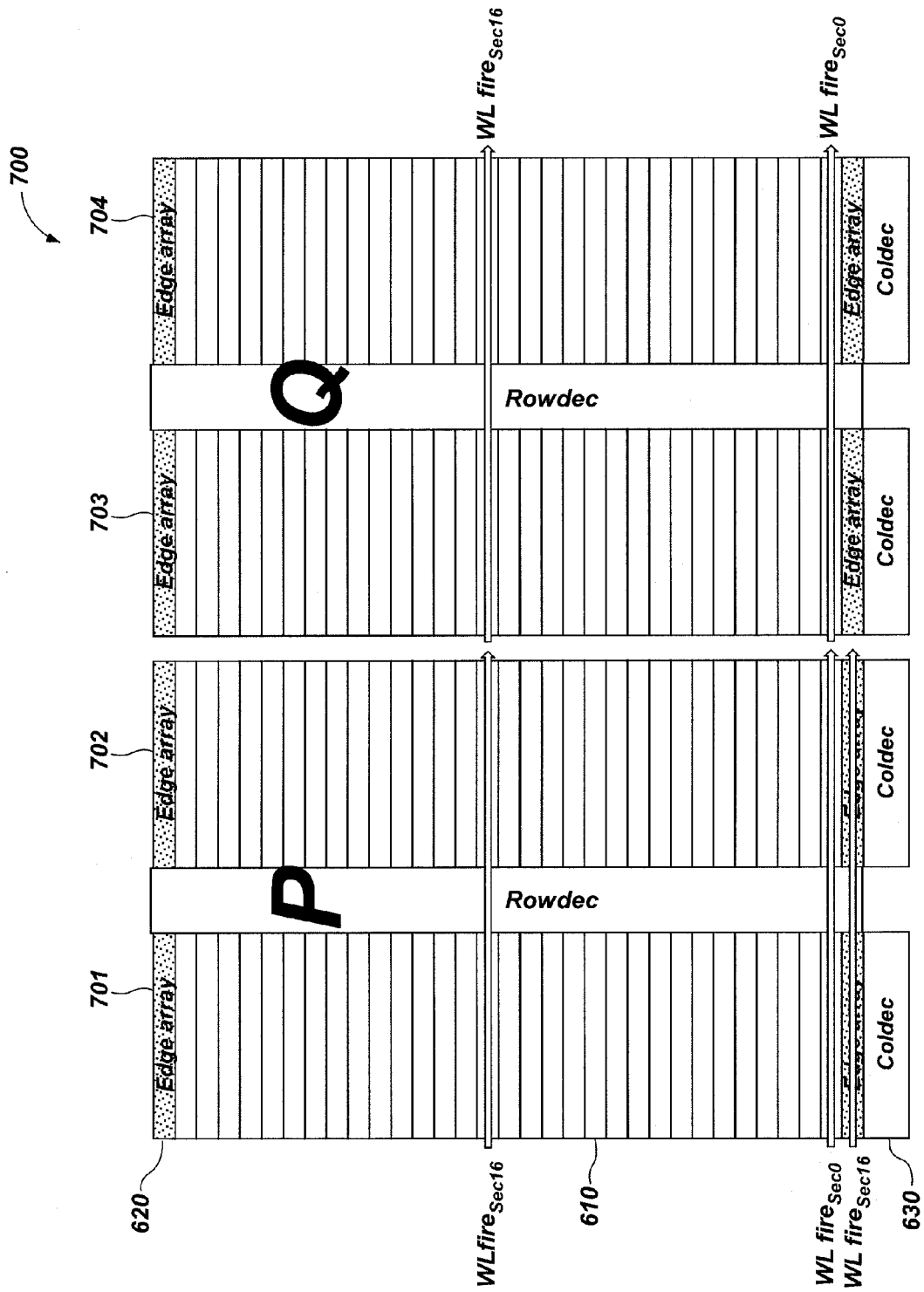
FIG. 7 illustrates a memory array undergoing a refresh operation with replacement elements as edge arrays.

FIG. 7 illustrates a memory array 700 undergoing a refresh operation with replacement elements as edge arrays. Memory array 700 is configured with a P side and a Q side of sub-arrays 701-704, each sub-array 701-704 including core arrays 610 divided into sections. Edge arrays 620 may be used as replacement elements for replacement (e.g., repair) of bad elements in the core array 610, or for other reasons. In this example, memory array 700 is a 256M array with 32 k word lines undergoing an 8 k refresh operation. Replacement elements are configured as edge arrays 620 which may be used for replacement (e.g., repair) of word lines in the core array 610 sections. As shown by FIG. 7, sections 0 and 16 are refreshed by activating (i.e., firing) word lines in sections 0 and 16. As previously discussed, during an 8 k refresh operation of a 256M array with 32 k word lines, four times as many rows must be fired relative to a normal memory access. In order to accomplish this, memory array 700 may be configured such that rows in the upper half and lower half of both the P and Q sides of the memory array 700 may be fired during the same refresh operation.

Further in this example, sections 0 and 16 of the Q side and section 0 of the P side function as intended for the refresh operation. However, a bad word line may exist within section 16 on the P side. In the event of a defective word line, the defective word line may be repaired by using the replacement elements in the edge array 620 in place of the defective word line of section 16. During refresh, when rows in sections 0 and 16 are to be fired, the replacement elements in the edge array 620 of section P are also fired in order to refresh the corresponding replacement word lines associated with the defective word lines in section 16.

Similar to the example of conventional memory arrays with distributed replacement elements, a problem may arise when word lines fire during the same refresh operation in adjacent sections of the memory array 700. As described previously, detecting circuitry share the digit lines across the sections. Sharing digit lines across sections allows detecting circuitry to act as a comparator, using an adjacent section as a reference array in order to determine the charge (e.g., 1 or 0) of the memory cells in the array that is being accessed. Under normal circumstances, for example, a sense amplifier turns on to detect either a 1 or a 0 on the memory cell of the accessed array in relation to an adjacent reference array that does not turn on. However, when two adjacent sections are fired in the same refresh operation, the reference function for the sense amplifiers between those two sections may be influenced, which may cause a failure (e.g., from the resulting data corruption) in the refresh operation. In other words, adjacent sections may both send data to sense amplifiers. When a section is fired, adjacent sections which normally are used as a reference may be marginalized because of the common sharing of sense amplifiers.

In the example shown in FIG. 7, section 0 fires and the bottom edge array 620 (which was used as a replacement solution for section 16) also fires during the same refresh operation. A failure caused by data contention may exist on the sense amplifiers as they are being shared by two sections (section 0 and bottom edge array 620) of the memory array 700. There may be a significantly diminished ability to sense a charge because the reference function needed by the sense amplifiers may not operate properly.

Figure 8A:
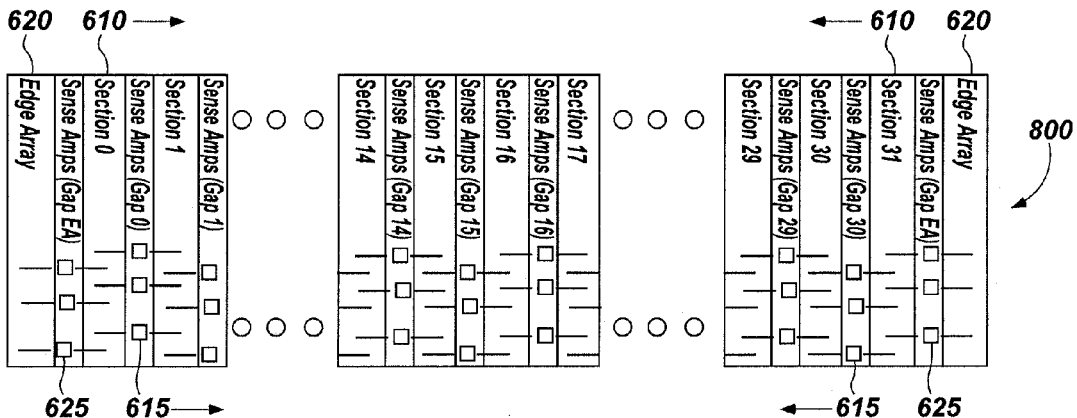
FIGS. 8A through 8C illustrate simplified memory arrays undergoing a refresh operation with replacement elements as edge arrays, further showing the operation of detecting circuitry and data contention.
Figure 8B:
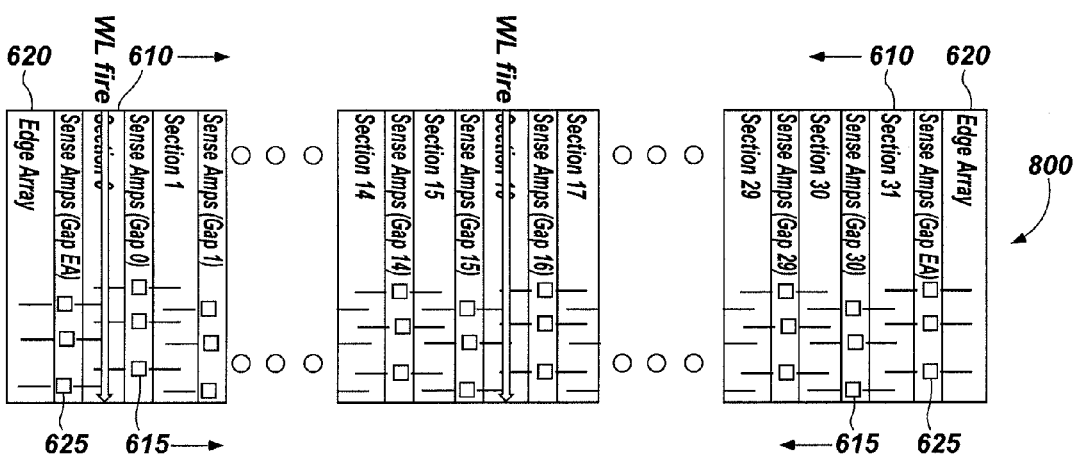
Figure 8C:
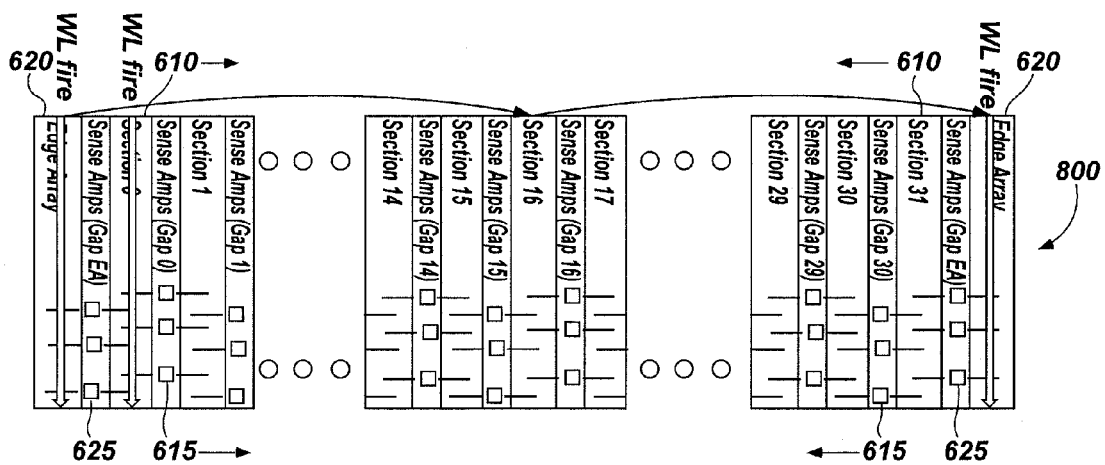

FIGS. 8A through 8C illustrate simplified memory arrays 800 undergoing a refresh operation with replacement elements as edge arrays, further showing the operation of detecting circuitry and potential data contention. As in previous examples, memory array 800 includes a core array divided into core array 610 sections. Edge arrays 620 are located on the two edges (i.e., ends) of the memory array 800. Core array 610 sections are located between edge arrays 620. Detecting circuitry, such as sense amplifiers 615, 625, are located between array sections. Edge array sense amplifiers 625 are located between the edge arrays 620 and an adjacent section of the core array 610.

In these examples, memory array 800 may be configured as a 64M memory array with 32 core array 610 sections (sections 0-31), each with 512 word lines such as might be used alone, or as a sub-array on the P or Q side of a 256M memory array. The edge arrays 620 may be configured with word lines coupled to replacement elements to repair defects (or replace for other reasons) in the core array 610 sections.

In FIG. 8B, one or more word lines may be fired during a refresh operation. In this example, sections 0 and 16 are refreshed during the same 8 k refresh operation. During refresh, when a word line fires in section 0, memory cells coupled to that word line are refreshed by sense amplifiers 615, 625 in both gap EA and gap 0. As a result, the sense amplifiers 625 use the edge array 620 or the sense amplifiers 615 use section 1, as the case may be, as a reference array to properly refresh the correct charge on the memory cells of section 0. When a word line fires in section 16, memory cells coupled to that word line are refreshed by sense amplifiers 615 in both gap 15 and gap 16. As a result, the sense amplifiers 615 use section 15 or section 17, as the case may be, as a reference array to properly refresh the correct charge on the memory cells of section 16.

In FIG. 8C, one or more word lines may be fired during a refresh operation in which a row has been replaced with replacement elements in the edge array 620. In this example, a word line in section 0 is fired. Under a normal condition, a word line in section 16 would also have been fired during a normal 8 k refresh operation. However, in this example, section 16 had a defect in a word line. Because of the defect, the address of the defective row was re-mapped to the replacement elements in the edge array 620. This re-mapping may occur to the edge array 620 in one or both of the top or bottom edge arrays 620. In conventional refresh operations, this re-mapping causes the corresponding word line in the edge arrays 620 to fire rather than in section 16. However, a corresponding word line in section 0 did not have defects, so that word line in section 0 also fires during the same refresh operation with the edge array 620. Rows would thus be fired on both sides of the sense amplifiers 625 in gap EA during the same refresh operation. As a result, data contention may exist, which may inhibit the edge sense amplifiers 625 from properly using section 0 as a reference array, and vice versa. This same problem would also exist if the top edge array 620 were mapped to fire at the same time as section 31 (i.e., if there were defects in section 15 that caused section 15 to be mapped to the top edge array 620 for repair).

Figure 9:
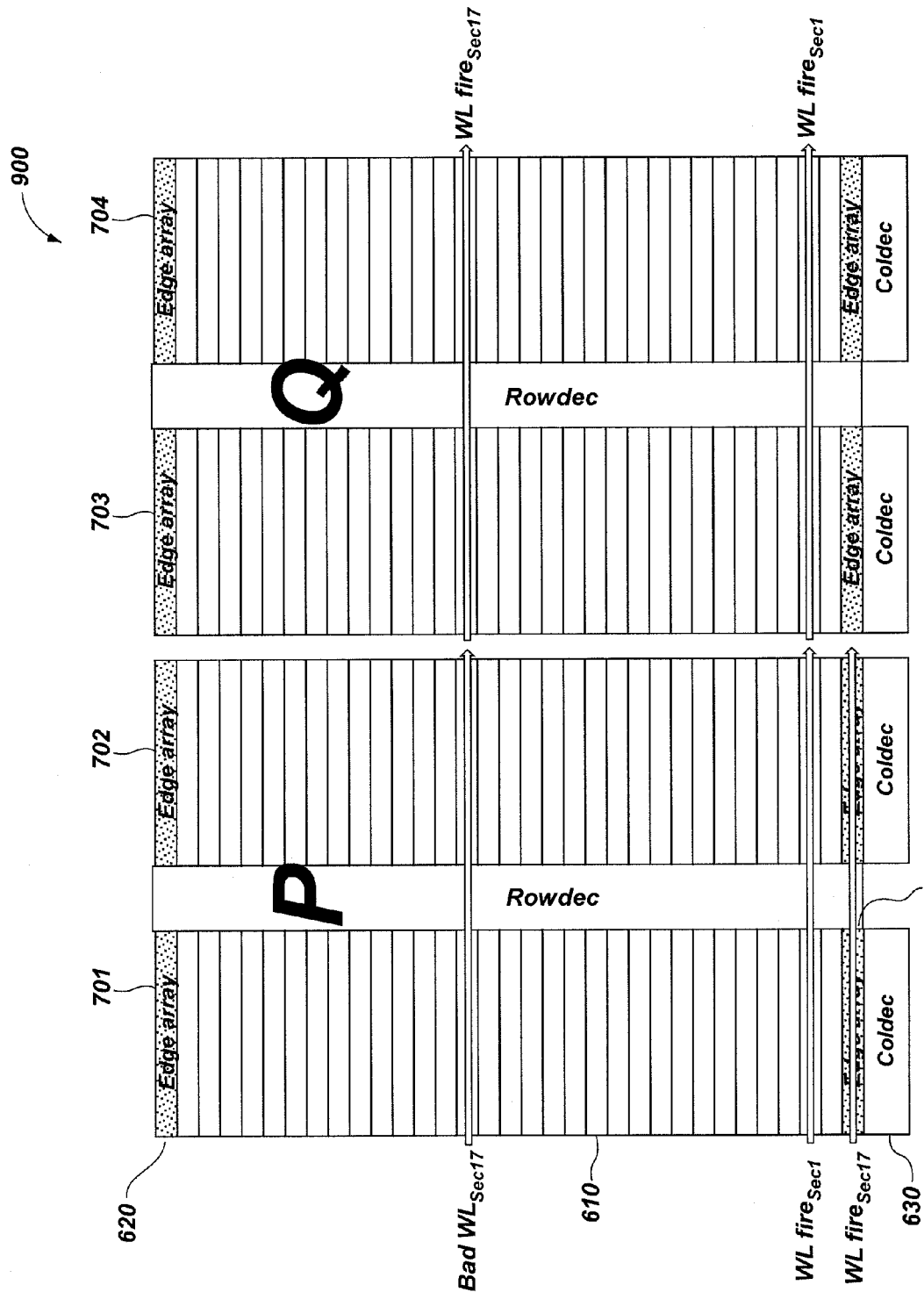
FIG. 9 illustrates a memory array during a refresh operation with replacement elements as edge arrays, in which the memory array experiences another type of failure during the refresh operation.

FIG. 9 illustrates a memory array 900 during a refresh operation with replacement elements as edge arrays in which memory array 900 experiences another type of potential failure during refresh. Memory array 900 is configured as before with core array 610 sections bounded by edge arrays 620. Memory array 900 is configured as a 256M memory array with four 64M sub-arrays 701-704, which form a P side and a Q side.

In this example, sections 1 and 17 are fired in both the P side and the Q side during an 8 k refresh operation. As depicted in FIG. 9, section 17 of the P side has a defective word line which caused the defective word line in section 17 of the P side to be repaired out by a corresponding replacement element in the edge array 620 of the P side. During refresh, word lines in section 1 and replacement elements in the edge array 620 (re-mapped from section 17) are fired during the same refresh operation. The data contention issue may not be a problem because section 1 and the edge array 620 do not share a sense amplifier. However, because the sections are nevertheless close in proximity, there may be coupling, which may increase noise when the sense amplifiers are fired. With data toggling on signals near each other, weaker sensing margins by the sense amplifiers may be experienced from the induced noise into the sense amplifiers.

In this example, the reference array for the edge array 620 is section 0. The reference array for section 1 is section 2 or section 0, as the case may be. In other words, because section 0 acts as a reference array during the same refresh access of both section 1 and the edge array 620, coupling and noise may be increased, which may reduce some of the sensing margins of the sense amplifiers. Accordingly, firing of adjacent sections of the memory array 900 during the same refresh operation may cause failure due to data contention from sharing sense amplifiers with the reference array. Firing of sections of the memory array 900 during the same refresh operation that are nearby (e.g., one section apart) may cause a failure due to increased noise due to coupling between nearby signals.

Although the problem associated with using edge arrays as replacement elements is similar to the example of conventional memory arrays with distributed replacement elements, the solution of linking the replacement solutions across a boundary does not exist. This lack of a proper solution for refresh of non-distributed replacement elements (e.g., using edge arrays 620) is one reason why replacement elements in edge arrays 620 are not used in conventional memory arrays.

Figure 10:
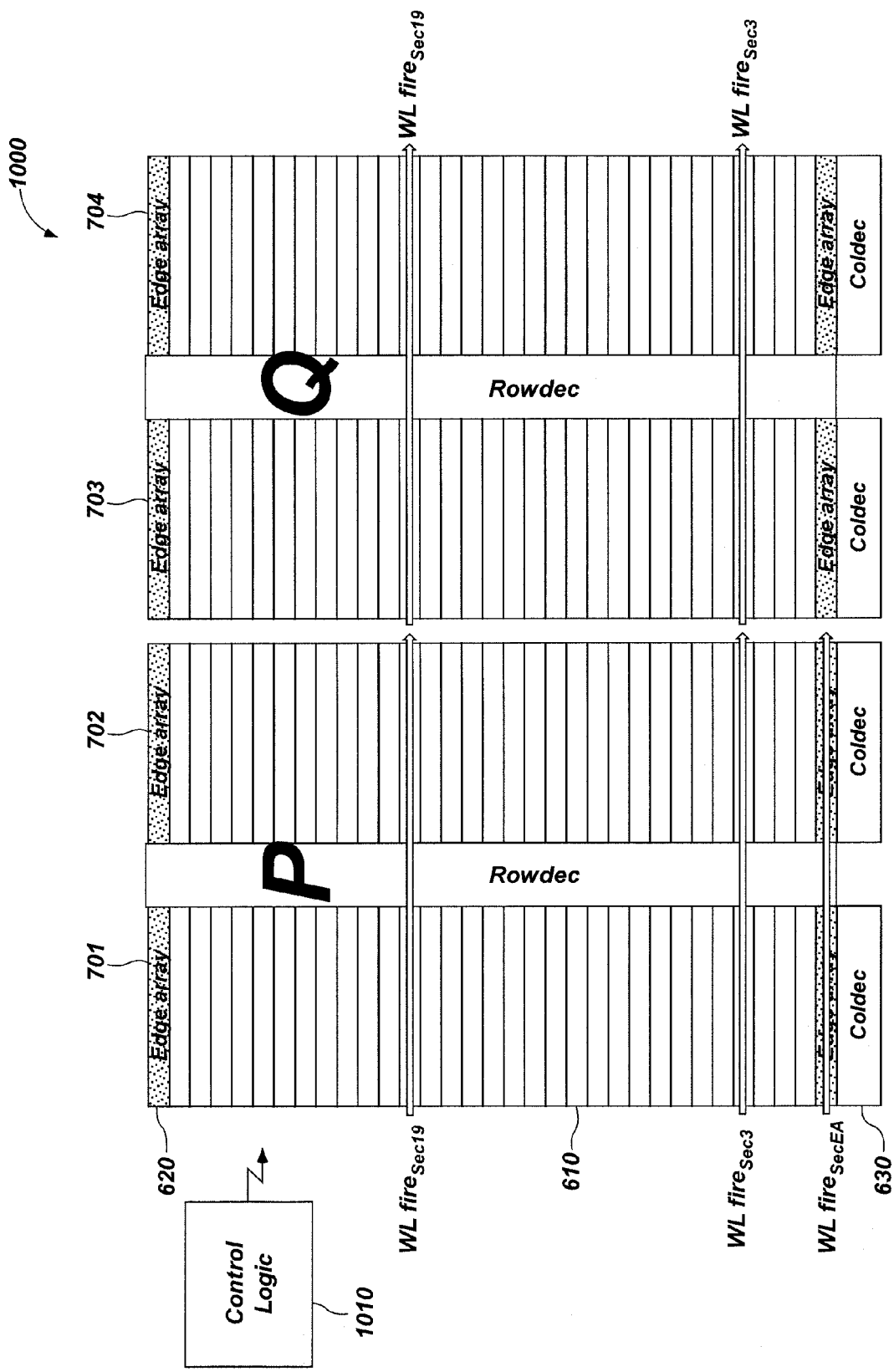
FIG. 10 illustrates a memory array undergoing a refresh operation with replacement elements as edge arrays according to an embodiment of the present invention.

FIG. 10 illustrates a memory array 1000 undergoing a refresh operation with replacement elements as edge arrays according to an embodiment of the present invention. Memory array 1000 may include a core array 610 divided into sections. Memory array 1000 may include replacement elements, such as edge arrays 620. In this example, memory array 1000 is configured as a 256M memory array, with four 64M sub-arrays 701-704 that form a P side and a Q side. Control logic 1010 may use address inputs to determine which rows to activate in the different sections. In addition, control logic 1010 may be used to determine which rows to selectively activate in the edge arrays 620 when the edge arrays 620 include replacement elements which may be used to repair defects, or otherwise replace elements, in the core array sections 610.

During refresh (e.g., 8 k refresh operation for a memory array with 16 k word lines), a plurality of word lines may be fired during the same refresh operation. One method to achieve this has been described, in which the most significant and second most significant address bits are ignored. These bits may determine whether the address for the word line is in the P or Q side, and whether the address is in the upper or lower half of the memory array 1000. In such a configuration, for a memory array with 32 sections, word lines during normal refresh may be 16 sections apart (e.g., sections 0 and 16, 1 and 17, . . . 15 and 31, etc.), which fire on both the P side and the Q side of memory array 1000.

In this example, word lines in section 3 and section 19 on the P side and the Q side are fired during the same refresh operation. As depicted in FIG. 10, the activated word lines for both sections 3 and 19 are not coupled to defective memory cells. However, imagine that previously it was discovered that a corresponding word line in either section 0 or section 16 was coupled to a defective memory cell (as shown in FIG. 8C). A defective word line in section 0 or section 16 may be repaired by re-mapping its address to a replacement element, such as an edge array 620 (see FIG. 8C). Under a conventional refresh operation, whenever the defective word line is to be fired, the corresponding re-mapped word line is fired in the replacement element (e.g., in edge array 620). In the case of a defective word line in section 16, re-mapping to a replacement element coupled to a word line in the bottom edge array 620 may cause a failure due to firing of an adjacent section (e.g., section 0 and the edge array 620) during the same refresh operation because the reference array function may not operate properly due to the same refresh operation firing both sides of the shared sense amplifiers.

To avoid such data contention (from firing of word lines in adjacent arrays), the control logic 1010 may be configured to selectively refresh the replacement element (e.g., edge array 620) at an occurrence when a non-neighboring array section (relative to the replacement element) is refreshed. Control logic 1010 may be configured to refresh the replacement memory elements only during a refresh operation activating an access line of a non-neighboring section of the array of memory cells in relation to the replacement memory elements.

For example, in addition to mapping access lines of the array sections to replacement access lines, and activating access lines of the array sections and the replacement access lines during refresh, control logic 1010 may be configured to ensure that the replacement access line is not activated when an access line in a neighboring section relative to the replacement access line is activated during refresh. A neighboring section can be an adjacent section and a section located one section away from the replacement element.

For example, data contention may be avoided by disabling replacement rows from firing when a corresponding re-mapped row would normally fire during refresh, and enabling the replacement rows to fire at an occurrence for refresh of a non-neighboring section of the array relative to the replacement row. Control logic 1010 of the memory array 1000 may be configured to link (i.e., tag) the replacement elements during a refresh operation with an address for a row in a non-neighboring section, such that the replacement elements fire with the firing of a row in a specific non-neighboring section of the memory array 1000. This solution may prevent simultaneous digit line access and its associated data contention. In the example above, the re-mapping link of section 16 to the edge array 620 is removed during refresh operations. When the refresh operation attempts to activate sections 0 and 16 during refresh, the edge array 620 will not be refreshed. The edge array 620 is then re-directed (e.g., linked) to refresh when a specific non-neighboring array (e.g., section 3 in FIG. 10) is refreshed.

If coupling or noise is introduced from firing neighboring arrays (see, e.g., FIG. 9) during the same refresh operation, it may be desired for control logic 1010 to be configured to refresh at an occurrence for refresh of a section of the array that is at least two sections away from the replacement elements to be refreshed. In such a configuration with replacement elements in the edge array 620, the edge array 620 may be fired during the same refresh operation with sections 2 and above, but would be disabled from firing during the same refresh operation for sections 0 and 16, or the same refresh operation for sections 1 and 17, even if these sections include word lines which were replaced by replacement elements in the edge array 620.

If the top edge array 620 is used for replacement (e.g., repair) of elements in the core array 110, similar issues exist as well. Accordingly, referring to FIG. 10, control logic may be configured to prohibit the top edge array 620 from firing in the same refresh operation with neighboring sections, such as section 31 (adjacent section) or section 30 (less than two away), to avoid data contention on the sense amplifiers, or coupling noise on the sense amplifiers, respectively. An example may be to link the refresh operation for the top edge array 620 with a section at least two sections away (e.g., section 29). Such linking may not be limited to sections at least two away from the edge array 620, and refreshing the edge array 620 with a section more than two sections away may even further reduce coupling noise on the sense amplifiers.

Alternative to linking, control logic 1010 may be responsive to an algorithm, which may be implemented based on the addresses that activate the sections themselves, to determine an alternate address decoding to be used for sections 0 and 1 (related to the bottom edge array) and sections 31 and 30 (related to the top edge array) when a neighboring edge array is being used. Once these addresses are determined, the new address decoding would ensure that the edge array would not fire in the same refresh operation as one of the neighboring sections. Such an algorithm may be less efficient and require more logic than linking (i.e., tagging) to fire a word line during the same refresh operation with a specific non-neighboring array section. Nevertheless, use of such an algorithm is contemplated as an embodiment of the present invention.

Of course one skilled in the art will recognize that a 256M memory array and a 64M memory array may be configured with a different number of word lines than illustrated herein, which is used as an example. One skilled in the art will recognize that different refresh rates may also be implemented such that more word lines may be fired during the same refresh operation than is shown in the examples herein. For example, exemplary refresh rates have been shown in which the refresh operation divides the core array 610 sections of memory array 1000 into halves in order to fire word lines in sections in the upper half and the lower half during the same refresh operation. Depending on the number of word lines and the refresh rate to be achieved, embodiments of the present invention may include refresh operations in which word lines are fired during the same refresh operation in more than two sections of the core array 610. For example, the core array 610 sections may be divided into quarters in order to fire word lines in four sections of the core array 610 during the same refresh operation. Thus, in the example of a 256M memory array, the multiple-row refresh may result in firing of sections that are eight sections apart during the same refresh operation. Additionally, the refresh operation may be part of an auto refresh operation, self refresh, CAS-Before-RAS (CBR), or another refresh operation in which more than one word line may be fired at a time.

Figure 11C:
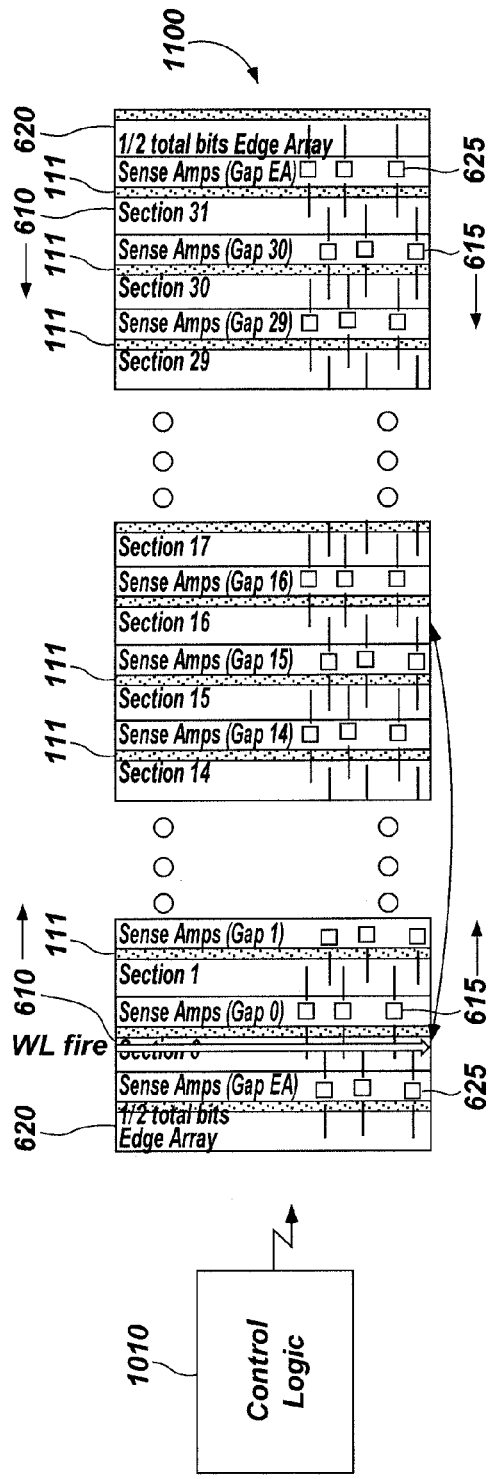

FIGS. 11A through 11C illustrate a memory array 1100 undergoing a refresh operation with distributed replacement elements 111 according to an embodiment of the present invention. The memory arrays 1100 may be configured to have the distributed replacement elements 111 distributed throughout the interior of the sections of the core array 610. Distributed replacement elements 111 may be uniformly distributed throughout the sections of the core array 610. However, uniform distribution is not required. Distributed replacement elements 111 may be addressed independently from the section they are located in. For example, a distributed replacement element 111 in section 1 may replace any area or section within memory array 1100. However, as previously described, problems may occur during refresh operations of the memory array 1100. The memory array 1100 may also include edge arrays 620. Edge arrays 620 may be used as replacement elements to repair defects that may be associated with word lines of the core array 610. Edge arrays 620 may also replace elements of the core array 610 for other reasons. Edge arrays may include the same number of word lines and bits as a normal section of the core array 610, or a different number as the case may be. As illustrated in FIGS. 11A through 11C, the edge arrays 620 are shown to be configured with half the number of bits as a normal core array 610 section.

Although FIGS. 11A through 11C show that both distributed replacement elements 111 and edge array 620 replacement elements can be combined in the same memory array 1100, a memory array may include replacement elements in an edge array only, distributed only, or a combination of both. For ease of discussion, refresh operations of memory array 1100 will be discussed in terms of distributed replacement elements 111. However, as shown by FIGS. 11A through 11C, a replacement solution which uses some combination of both distributed array and edge array is contemplated.

In FIG. 11B section 0 and section 16 refresh together during a refresh operation (e.g., 8 k refresh operation for a memory array with 16 k word lines). For example, if a word line in section 0 or in section 16 is defective, a distributed replacement element 111 may be used to repair (or otherwise replace) and re-map the address of the defective word lines in an appropriate distributed replacement element 111 section. Because of the re-mapping and the firing of sections during the same refresh operations, the problem of data contention on the sense amplifiers and undesired coupling noise may also exist in these examples if a distributed replacement element 111 is fired along with a neighboring section (e.g., one or two sections away) during the same refresh operation. As previously discussed, conventional memory arrays may attempt to solve these problems by linking the replacement solution across the 8 k word line boundary. In other words, the replacement of a section on one half of the boundary is tied (i.e., dependent) on the replacement of the section on the other half of the boundary. This method for replacement and refresh may have the advantage of avoiding data contention or reducing noise caused by coupling to some extent, however, distributed replacement elements 111 may have less flexibility in what sections the distributed replacement elements 111 can replace. Additionally, linking the replacement solution across the 8 k word line boundary may still be ineffective if the memory array 1100 has more defective word lines, as spacing becomes more difficult, and it may also reduce yield because good word lines may have been unnecessarily replaced.

FIG. 11C illustrates replacement and refresh of a memory array 1100 in which distributed replacement elements 111 exist, yet still maintains flexibility for replacement and refresh. As before, sections 0 and 16 may refresh during the same refresh operation. In this example, distributed replacement elements 111 are not linked across a boundary in the memory array 1100.

The memory array 1100 may include control logic 1010 configured to selectively refresh the replacement element (e.g., distributed replacement elements 111) at an occurrence when a non-neighboring section (relative to the replacement element) is refreshed. Control logic 1010 may be configured to allow the refresh of the replacement elements (e.g., distributed replacement elements 111 and/or those located in the edge array 620) to be independent of the replacement solution. In other words, the replacement elements may be independently refreshed regardless of what sections they are being used to replace. This may allow control logic 1010 to be configured to ensure during refresh that an access line is coupled to the replacement element and is activated when an access line in a section other than the neighboring section is activated during a refresh operation.

Such data contention may be avoided by, for example, disabling re-mapped replacement rows from firing when the corresponding defective rows would normally fire during a refresh operation, and enabling re-mapped replacement rows to fire at an occurrence for refresh of a respective non-neighboring section of the array. For example, control logic 1010 of the memory array 1100 may be configured to link (during a refresh operation) the replacement elements with an address for a non-neighboring section, such that the replacement elements fire with the firing of a specific non-neighboring section of the array. This solution may prevent simultaneous digit line access and its associated data contention. In the example above, the re-mapping link of section 16 to the distributed replacement elements 111 is removed during refresh operations if it were re-mapped to the edge array 620 or a replacement element located in section 0, 1, or 2. As a result, when the refresh operation cycles to sections 0 and 16, the distributed replacement element 111 mapped for the defective word line in section 16, but located in the edge array 620, or section 0 or 1 will not be refreshed. The distributed replacement element 111 is then re-directed and selectively refreshed (e.g., tagged) when a specific non-neighboring array (e.g., section 3 or 4 or more) is refreshed.

If coupling or noise is introduced from firing of neighboring arrays, control logic 1010 may be configured to refresh at an occurrence for refresh of a section of the array which is at least two sections away from the replacement elements to be refreshed. In such a configuration the distributed replacement element 111 may be fired in the same refresh operation with sections at least two away from the edge array 620 or section 1 (e.g., section 4).

Being able to maintain a flexible distributed replacement scheme and avoiding data contention and/or undesired noise may significantly increase yield of the memory array 1100. Because replacement solutions are not tied to (i.e., dependent upon) each other, the number of wasted replacement elements used to unnecessarily replace good word lines may be reduced. Additionally, the approach described herein allows distributed replacement elements 111 in any section to be used for replacement regardless of which half of the array the section with the defective word line or defective section lies. For example, distributed replacement elements 111 in section 0 can be used to replace defective elements in any section, including sections 16-31, and distributed replacement elements 111 in section 16 can be used to replace defective elements in any section, including sections 0-15. Distributed replacement elements 111 do not need to be tied to (i.e., dependent upon) the replacement solution of the other section across the 8 k boundary. For example, distributed replacement elements 111 may have been used in any section of the memory array 1100, and distributed replacement elements 111 used to replace word lines, which will be refreshed together, do not need to be spaced 16 sections apart in an 8 k refresh of 16 k word lines. As a result, each distributed replacement element 111 may be able to replace as many addressable rows as included in the entire memory array 1100 (e.g., 16 k in a 64M memory array), while still avoiding data contention and/or significant noise from coupling. Conventional approaches using distributed replacement elements may only have been able to be addressed to about half as many addresses, at best, and with much less flexibility, as distributed replacement elements begin to be used.

Referring still to FIGS. 11A through 11C, memory array 1100 may include a combination of both edge arrays 620 and distributed replacement elements 111 for replacement (e.g., repair of defective cells). Embodiments of the invention may further expand the row replacement (e.g., row repair) when integrating edge arrays 620 with distributed replacement elements 111. Such a replacement operation may include managing the row replacement preferences between the edge array 620 and distributed replacement elements 111 in order to, for example, prioritize the replacement based on characteristics of the replacement to be performed. Setting such priorities may determine how the edge replacement will behave based on the replacement signature. Managing the priority on the row replacement preferences may increase reparability using replacement rows with edge replacement.

A first priority may be used for a replacement (e.g., repair of a defective row) on the edge array 620. For example, an edge array 620 may be used to replace a large block, such as an entire section of the core array 610. It may be possible that at least one of the word line rows on the edge array 620 is also defective. In this situation, the first priority is to repair the defects in the edge array 620 by using the distributed replacement element 111 local to the sections of the core array 610. For example, a portion (or all) of an interior core array 610 (e.g., section 16) may be defective and re-mapped to the edge array 620. If, however, a word line (e.g., WL0) of the edge array 620 is also defective, then the portion (or all) of the interior core array 610 may instead be re-mapped to a distributed replacement element 111 within an interior core array 610 section. Alternatively, a single word line in an interior core array 610 section may be defective, and a word line of the edge array 620 may be defective. In that case, the defective single word line of the core array 610 may instead be re-mapped to a distributed replacement element 111 within an interior section of the core array 610. In both situations, the first priority may disable the edge array 620 replacement solution for the defective word line (e.g., WL0) while allowing the distributed replacement element 111 replacement solution to fire. As an example of one embodiment, control logic 1010 (e.g., an internal software algorithm) may pre-test available replacement solutions, become aware of defects in the edge array 620, and select a suitable replacement solution including the distributed replacement elements 111.

A second priority may be used to permit the edge array to have priority over the distributed replacement rows. For example, an edge array 620 may be used to replace (e.g., repair) out an entire section of the core array 610. This priority allows for salvaging the distributed replacement elements 111 that are included within the bad section. This may occur because the edge array 620 physically maps the prime rows and distributed replacement elements 111 when replacing out an entire interior section. In other words, the edge array 620 includes the distributed replacement elements 111 associated with the defective core section of the core array 610. However, in order to access the distributed replacement elements 111 mapped to the edge array 620, the edge array 620 may be allowed to have priority over the distributed replacement element 111 replacement in order to assign a mapped address to the core array 610 section.

A third priority may be used to permit both the edge array 620 and the distributed replacement elements 111 to form a combined replacement solution. For example, the edge array 620 may be needed to repair IO shorts. Because half the data may be corrupted by the IO shorts, active rows in both the core array 610 and the edge array 620 may be needed for a successful repair. In this priority, both the edge array 620 and the distributed replacement elements 111 participate in the replacement solution.

Figure 12:
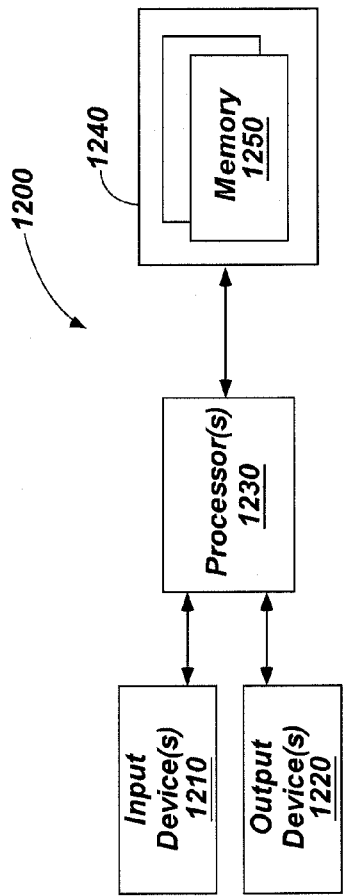
FIG. 12 illustrates a simplified block diagram of a system implemented according to one or more embodiments described herein.

FIG. 12 illustrates a simplified block diagram of an electronic system 1200 implemented according to one or more embodiments described herein. The electronic system 1200 includes at least one input device 1210, at least one output device 1220, a memory access device, such as one or more processors 1230, and one or more memory devices 1240. The memory devices 1240 include at least one semiconductor memory 1250 incorporating at least one embodiment of the devices or methods described herein. The electronic system 1200 may be part of a number of computing, processing, and consumer products. As non-limiting examples, some of these products may include personal computers, handheld devices, cameras, phones, wireless devices, displays, chip sets, set top boxes, games, and vehicles.

Conclusion

Embodiments of the disclosure may include methods, memories, and systems, such as those which replace elements in and refresh memory arrays. A memory may include a memory cell array divided into sections. At least one section of the memory cell array has a digit line. The memory further includes a replacement element having a digit line. The memory further includes detecting circuitry coupled to the digit line of the at least one section of the memory cell array and coupled to the digit line of the replacement element. The memory further includes control logic configured to selectively refresh the replacement element at an occurrence when a non-neighboring section of the memory cell array relative to the replacement element is refreshed.

In other embodiments, a memory includes an array of memory cells divided into sections. The memory further includes replacement memory elements. The memory further includes control logic configured to refresh the replacement memory elements only during a refresh operation activating an access line of a non-neighboring section of the array of memory cells in relation to the replacement memory elements.

Methods of refreshing a memory array with replacement elements are disclosed. Such methods may include refreshing replacement elements of a memory array only during a same refresh operation with a non-neighboring section of memory elements of the memory array, wherein the non-neighboring section is in relation to the replacement elements.

Another method for refreshing a memory array with replacement elements includes activating a first access line in a first section of an array of memory cells and a second access line in a second section of the array of memory cells during a refresh operation when the first access line and the second access line are not re-mapped. The method further includes activating the first access line and a replacement access line during the refresh operation when the second access line is re-mapped to the replacement access line. The method further includes ensuring that the replacement access line is activated during a refresh operation different from a refresh operation of the first access line when the first section of the array of memory cells is a neighboring section relative to the replacement access line.

Other methods for reducing failure during a refresh operation of replacement elements include disabling a replacement row from firing when a corresponding re-mapped row of a memory array would normally fire during a refresh operation. The corresponding re-mapped row is mapped to the replacement row. The method further includes enabling the replacement row to fire at an occurrence for refresh of a non-neighboring section of the memory array relative to the replacement row.

A system may include at least one memory access device, and at least one semiconductor memory operably coupled to the at least one memory access device. The at least one semiconductor memory includes array sections comprising access lines. The at least one semiconductor memory includes a replacement element comprising replacement access lines. The at least one semiconductor memory further includes control logic. The control logic is configured to map at least one of the access lines of the array sections to at least one of the replacement access lines. The control logic is further configured to activate access lines of the array sections and the replacement access lines of the replacement element during refresh. The control logic is further configured to ensure that a replacement access line is not activated when an access line in a neighboring section relative to the replacement access line is activated during refresh.

Although the present invention has been described with reference to particular embodiments including specific sizes and configurations of memory arrays, the present invention is not limited to these described embodiments. As such, memory arrays with different capacities and refresh rates may be used, and the present invention is limited only by the appended claims and their legal equivalents.

What is claimed is:

1. A memory, comprising:
    a memory cell array divided into sections, at least one section of the memory cell array having a digit line;
    a replacement element having a digit line;
    detecting circuitry coupled to the digit line of the at least one section of the memory cell array and coupled to the digit line of the replacement element; and
    control logic configured to selectively refresh the replacement element at an occurrence when a non-neighboring section of the memory cell array relative to the replacement element is refreshed.

2. The memory of claim 1, wherein the non-neighboring section is at least two sections away from the replacement element.

3. The memory of claim 1, wherein the non-neighboring section is at least one section away from the replacement element.

4. The memory of claim 1, wherein the replacement element is configured to be mapped to in order to repair a defective cell of the memory cell array.

5. The memory of claim 1, wherein the detecting circuitry includes a sense amplifier.

6. The memory of claim 1, wherein each of the sections of the memory cell array include a plurality of access lines.

7. The memory of claim 1, wherein the replacement element comprises a replacement access line, and the control logic configured to selectively refresh is configured to ensure that the replacement access line is activated during a refresh operation different from a refresh operation of an access line of the non-neighboring section of the memory cell array.

8. The memory of claim 1, wherein the control logic configured to selectively refresh is configured to:
    disable a replacement row of memory cells of the replacement element from refreshing when a corresponding row of at least one section of the memory cell array would have normally fired during refresh; and enable the replacement row to refresh at the occurrence when a row in the non-neighboring section of the memory cell array relative to the replacement element is refreshed.

9. The memory of claim 1, wherein the control logic configured to selectively refresh is configured to link, during a refresh operation, the replacement element with an address for a logical row of memory cells in the non-neighboring section, such that the replacement element fires with the firing of the logical row of memory cells during the refresh operation.

10. The memory of claim 9, wherein the control logic configured to selectively refresh is configured to remove a replacement link, during a refresh operation, for the replacement element and an associated row of the memory cell array which the replacement element is to replace, such that the replacement element does not fire during refresh of the associated row of the memory cell array.

11. The memory of claim 1, wherein the sections of the memory cell array comprise a core memory cell array, and the replacement element is located adjacent to at least one end of the core memory cell array.

12. The memory of claim 1, wherein the replacement element is distributed throughout the sections of the memory cell array.

13. The memory of claim 1, wherein the replacement element is at least partially distributed throughout the sections of the memory cell array to form at least one distributed replacement element, and wherein at least a portion of the replacement element is located on at least one end of the memory cell array to form at least one edge replacement section.

14. The memory of claim 13, wherein the control logic is further configured to manage replacement preferences between the at least one edge replacement section and the at least one distributed replacement element in order to prioritize a replacement based on characteristics of the replacement to be performed.

15. The memory of claim 14, wherein the replacement preferences comprise:
a first priority configured to replace the atleast a portion of the replacement element in the at least one edge replacement section by using the at least one distributed replacement element;
a second priority including allowing the at least one edge replacement section to have priority over replacement using the at least one distributed replacement element in order to assign a mapped address to the sections of the memory cell array; and
a third priority including forming a replacement solution by combining replacement elements from both the at least one edge replacement section and the at least one distributed replacement element.

16. A memory, comprising:
an array of memory cells divided into sections;
replacement memory elements; and
control logic configured to refresh the replacement memory elements only during a refresh operation activating an access line of a non-neighboring section of the array of memory cells in relation to the replacement memory elements.

17. The memory of claim 16, wherein the control logic is further configured to:
refresh the array of memory cells under a normal refresh operation during a refresh operation including:
activating an access line located in a lower half of the array of memory cells; and
activating another access line located in an upper half of the array of memory cells, wherein the access line located in the lower half and the another access line located in the upper half have not been replaced by the replacement memory elements.

18. The memory of claim 16, wherein the replacement memory elements are located adjacent to an end of an upper half of the array of memory cells to form a replacement edge array, wherein a section of the array of memory cells adjacent to the replacement edge array includes a last normally addressable access line of the array of memory cells.

19. The memory of claim 16, wherein the non-neighboring section of the array of memory cells is at least two sections away from the replacement memory elements.

20. A method for refreshing a memory array with replacement elements, the method comprising:
refreshing replacement elements of a memory array only during a same refresh operation with a non-neighboring section of memory elements of the memory array, wherein the non-neighboring section is in relation to the replacement elements.

21. The method of claim 20, wherein refreshing the replacement elements of the memory array includes linking the replacement elements of the memory array to refresh during the same refresh operation as the non-neighboring section, wherein the non-neighboring section is a specific linked section of the memory array.

22. The method of claim 20, wherein the non-neighboring section is a section that is at least two sections away from the replacement elements.

23. The method of claim 20, wherein the non-neighboring section is a section that is at least one section away from the replacement elements.

24. The method of claim 20, wherein refreshing the replacement elements of the memory array includes selectively refreshing an edge replacement section located on an end of a section of memory elements of the memory array.

25. The method of claim 24, further comprising managing row replacement preferences between the edge replacement section and replacement elements distributed throughout the memory array, wherein managing row replacement preferences comprises:
permitting a first priority configured to replace replacement elements in the edge replacement section by using the replacement elements distributed throughout the memory array;
permitting a second priority including allowing the edge replacement section to have priority over replacement using the replacement elements distributed throughout the memory array; and
permitting a third priority including forming a replacement solution by combining rows from both the edge replacement section and the replacement elements distributed throughout the memory array.

26. A method for refreshing a memory array with replacement elements, the method comprising:
activating a first access line in a first section of an array of memory cells and a second access line in a second section of the array of memory cells during a refresh operation when the first access line and the second access line are not re-mapped;
activating the first access line and a replacement access line during refresh when the second access line is re-mapped to the replacement access line; and ensuring that the replacement access line is activated during a refresh operation different from a refresh operation of the first access line when the first section of the array of memory cells is a neighboring section relative to the replacement access line.

27. The method of claim 26, wherein ensuring occurs when the neighboring section is adjacent to the replacement access line.

28. The method of claim 26, wherein ensuring comprises:
executing instructions from an algorithm to decode refresh addresses to determine when the neighboring section is to be refreshed; and
prohibiting the replacement access line from being activated in a same refresh operation as the neighboring section.

29. The method of claim 26, wherein ensuring includes prohibiting the replacement access line from activating during a refresh operation of the first access line when the first section of the array of memory cells is the neighboring section relative to the replacement access line.

30. The method of claim 26, wherein ensuring comprises linking the replacement access line to activate when a specific non-neighboring section of the array of memory cells is refreshed.

31. The method of claim 30, wherein linking includes:
removing a replacement link of the second access line to the replacement access line; and
re-directing the replacement access line to activate when the specific non-neighboring section is refreshed.

32. A method for reducing failure during a refresh operation of replacement elements, comprising:
disabling a replacement row from firing when a corresponding re-mapped row of a memory array would normally fire during refresh, wherein the corresponding re-mapped row is mapped to the replacement row; and
enabling the replacement row to fire at an occurrence for refresh of a non-neighboring section of the memory array relative to the replacement row.

33. A system, comprising:
at least one memory access device; and
at least one semiconductor memory operably coupled to the at least one memory access device,
the at least one semiconductor memory comprising:
array sections comprising access lines;
a replacement element comprising replacement access lines; and
control logic configured to:
map at least one of the access lines of the array sections to at least one of the replacement access lines;
activate access lines of the array sections and the replacement access lines of the replacement element during refresh; and
ensure that a replacement access line is not activated when an access line in a neighboring section relative to the replacement access line is activated during refresh.

34. The system of claim 33, wherein the neighboring section is at least two array sections away from the replacement access line to be refreshed.

* * * * *